(12) United States Patent
Ikegami et al.

(10) Patent No.: US 12,431,190 B2
(45) Date of Patent: Sep. 30, 2025

(54) MEMORY SYSTEM

(71) Applicant: Kioxia Corporation, Tokyo (JP)

(72) Inventors: Kazutaka Ikegami, Inagi (JP); Rieko Funatsuki, Yokohama (JP); Nobuyuki Momo, Yokohama (JP); Hidehiro Shiga, Yokohama (JP)

(73) Assignee: Kioxia Corporation, Tokyo (JP)

( * ) Notice: Subject to any disclaimer, the term of this patent is extended or adjusted under 35 U.S.C. 154(b) by 169 days.

(21) Appl. No.: 18/500,478

(22) Filed: Nov. 2, 2023

(65) Prior Publication Data

US 2024/0071477 A1    Feb. 29, 2024

Related U.S. Application Data

(63) Continuation of application No. PCT/JP2022/000556, filed on Jan. 11, 2022.

(30) Foreign Application Priority Data

May 24, 2021  (JP) ................. 2021-087132

(51) Int. Cl.
*H10B 41/27*     (2023.01)
*G11C 11/4091*   (2006.01)
(Continued)

(52) U.S. Cl.
CPC ...... *G11C 11/4096* (2013.01); *G11C 11/4091* (2013.01); *G11C 11/4094* (2013.01); *G11C 11/4099* (2013.01)

(58) Field of Classification Search
CPC ............ G11C 11/4096; G11C 11/1091; G11C 11/4094; G11C 11/4099
See application file for complete search history.

(56) References Cited

U.S. PATENT DOCUMENTS 12,211,567 B2 *  1/2025  Ikegami ................. G11C 16/08
2015/0340369 A1  11/2015  Lue
(Continued)

FOREIGN PATENT DOCUMENTS

JP    2015-228484 A    12/2015
JP    2017-135238 A     8/2017
(Continued)

OTHER PUBLICATIONS

International Search Report issued Mar. 1, 2022 in PCT/JP2022/000556 filed Jan. 11, 2022, 3 pages.

*Primary Examiner* — Min Huang
(74) *Attorney, Agent, or Firm* — Oblon, McClelland, Maier & Neustadt, L.L.P.

(57) ABSTRACT

A memory system for speeding up a read operation in the memory system includes a first pillar, a first string including a first transistor and a first memory cell, a second string including a second transistor and a second memory cell, a first bit line, a first gate line, a first word line, a second gate line, a second word line and a control circuit. When the control circuit executes a read operation with respect to the first memory cell, the control circuit is configured to apply a read voltage to the first word line, apply a voltage turning off the second memory cell regardless of an electric charge stored in the second memory cell to the second word line, apply a voltage turning on the first transistor to the first gate line, and apply a voltage turning on the second transistor to the second gate line.

13 Claims, 28 Drawing Sheets

(51) Int. Cl.
    *G11C 11/4094*     (2006.01)
    *G11C 11/4096*     (2006.01)
    *G11C 11/4099*     (2006.01)

(56) References Cited

U.S. PATENT DOCUMENTS

| | | | |
|---|---|---|---|
| 2017/0213845 A1 | 7/2017 | Baba | |
| 2017/0271021 A1* | 9/2017 | Futatsuyama | G11C 16/10 |
| 2018/0277565 A1* | 9/2018 | Futatsuyama | G11C 16/26 |
| 2019/0074066 A1* | 3/2019 | Shimada | G11C 16/0483 |
| 2020/0090752 A1 | 3/2020 | Kato et al. | |
| 2020/0411109 A1 | 12/2020 | Yang et al. | |

FOREIGN PATENT DOCUMENTS

| | | |
|---|---|---|
| JP | 2017-168163 A | 9/2017 |
| JP | 2018-164070 A | 10/2018 |
| JP | 2019-46529 A | 3/2019 |
| JP | 2020-47348 A | 3/2020 |

\* cited by examiner

FIG. 21

| add. | Embodiment | | Conventional |
| --- | --- | --- | --- |
| | Physical Address | Logical Address | Physical Address & Logical Address |
| | Assignment | Assignment | Assignment |
| ... | ... | ... | ... |
| 13 | SDL-High-bit | SDL-Low-bit | SDL-High-bit |
| 12 | SDL-Middle-bit | SDL-High-bit | SDL-Middle-bit |
| 11 | SDL-Low-bit | SDL-Middle-bit | SDL-Low-bit |
| ... | ... | ... | ... |
| 0 | | | |

FIG. 24

Logical Address  | 13 | 12 | 11 |   000
                                  001

Physical Address | 11 | 12 | 13 |   000 : BL0
                                    100 : BL4

MEMORY SYSTEM

CROSS REFERENCE TO RELATED APPLICATIONS

This application is a Continuation of International Patent Application No. PCT/JP2022/000556, filed on Jan. 11, 2022, which claims the benefit of priority to Japanese Patent Application No. 2021-087132 filed on May 24, 2021, the entire contents of which are incorporated herein by reference.

FIELD

Embodiments of the present disclosures relate to a memory system provided with a semiconductor storage device.

BACKGROUND

A memory system, which includes a NAND-type flash memory as a semiconductor storage device and a controller, which controls the NAND-type flash memory, is known.

SUMMARY

A memory system according to an embodiment includes: a first pillar including semiconductor; a first string adjacent to the first pillar and including a first transistor and a first memory cell connected in series; a second string adjacent to the first pillar and including a second transistor and a second memory cell connected in series; a first bit line connected to the first transistor and the second transistor; a first gate line connected to the first transistor and arranged above a first insulating layer; a first word line connected to the first memory cell and arranged above a second insulating layer; a second gate line connected to the second transistor, arranged above the first insulating layer and sandwiching the first pillar with the first gate line; a second word line connected to the second memory cell, arranged above the second insulating layer and sandwiching the first pillar with the first word line; a second pillar including a semiconductor; a third string adjacent to the second pillar and including a third transistor and a third memory cell connected in series; a fourth string adjacent to the second pillar and including a fourth transistor and a fourth memory cell connected in series; a second bit line connected to the third transistor and the fourth transistor; a third gate line connected to the fourth transistor, arranged above the first insulating layer and sandwiching the second pillar with the first gate line; and a control circuit. Wherein the third transistor is connected to the first gate line, the third memory cell is connected to the first word line, the fourth memory cell is connected to the second word line, the second pillar is sandwiched by the first word line and the second word line, the first bit line and the second bit line overlap each of the first pillar and the second pillar in a plan view, the first bit line is connected to the first pillar and is not connected to the second pillar, the third bit line is connected to the second pillar and is not connected to the first pillar, when the control circuit executes a read operation with respect to the first memory cell, the control circuit is configured to apply a read voltage to the first word line, apply a voltage turning off the second memory cell regardless of an electric charge stored in the second memory cell to the second word line, apply a voltage turning on the first transistor to the first gate line, and apply a voltage turning on the second transistor to the second gate line, and when the control circuit executes a read operation with respect to the third memory cell, the control circuit is configured to apply a read voltage to the first word line, apply a voltage turning off the fourth memory cell regardless of an electric charge stored in the fourth memory cell to the second word line, apply a voltage turning on the third transistor to the first gate line, and apply a voltage turning on the fourth transistor to the second gate line.

BRIEF DESCRIPTION OF DRAWINGS

FIG. 21 is a diagram showing an example of an address conversion table in a semiconductor memory device according to an embodiment.

FIG. 24 is a diagram showing an example of converting an allocation of column addresses in a peripheral circuit of a memory system according to an embodiment.

DESCRIPTION OF EMBODIMENTS

Figure 1:
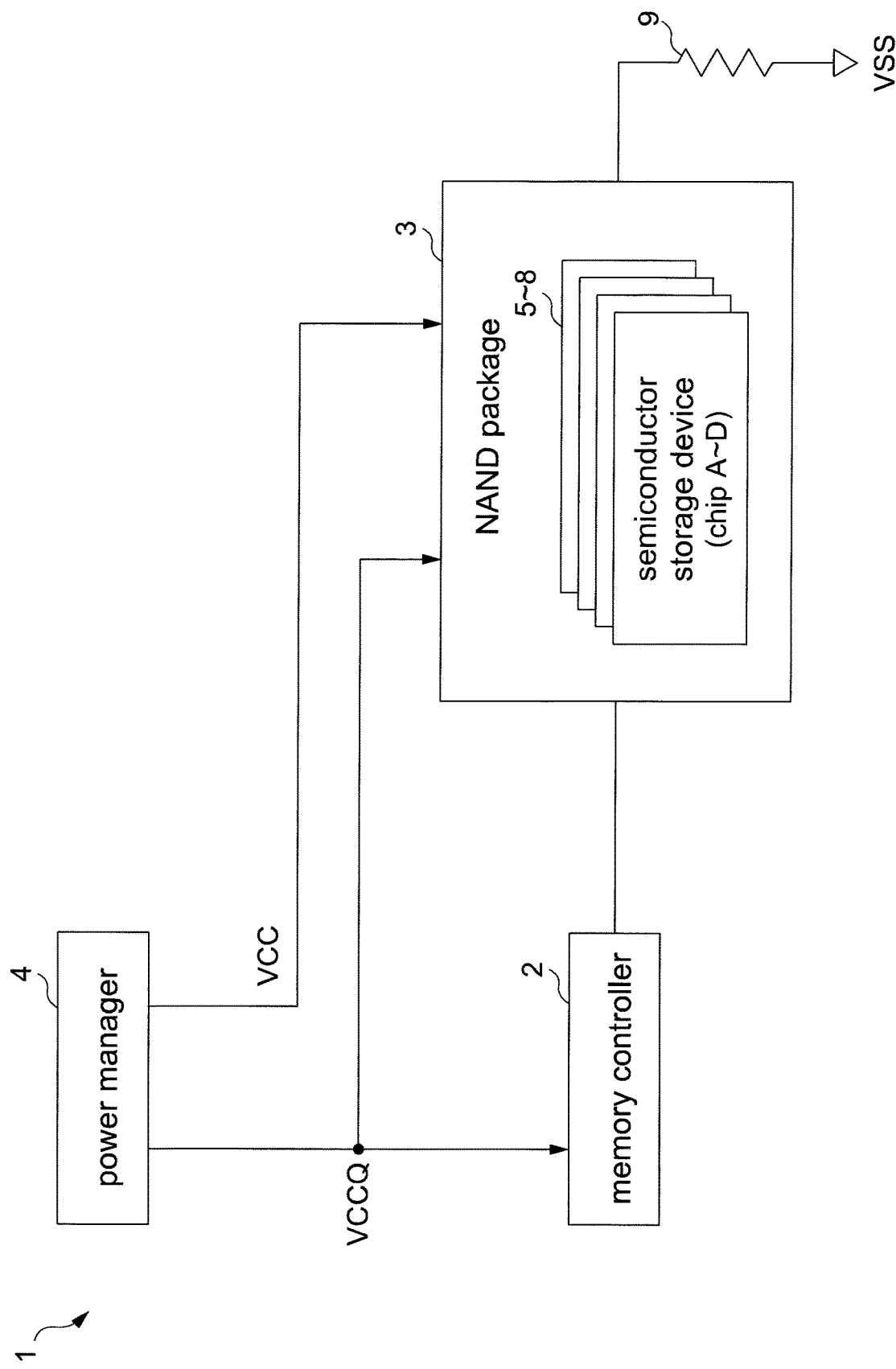
FIG. 1 is a block diagram illustrating a power supply system of a memory system according to an embodiment.

Hereinafter, a non-volatile semiconductor storage device according to the present embodiments are described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited to the material, shape, structure, arrangement and the like of the constituent parts described below. Various modifications may be made to the technical idea of the embodiment in addition to the scope of the claims.

Further, in the following description, signals X<n:0>("n" is a natural number) are made up of (n+1)-bit signals, and mean a group of signals X<0>, X<1>, . . . , and X<n>, each of which is a 1-bit signal. In addition, elements Y<n:0> mean a group of elements Y<0>, Y<1>, . . . , and Y<n>, which correspond to the input or output of the signals X<n:0> in a one-to-one relationship.

In the following description, a signal BZ indicates that it is an inverted signal of a signal Z. Alternatively, when the signal Z is a control signal, the signal Z is a positive logic and the signal BZ is a negative logic. That is, the "H" level of the signal Z corresponds to assertion, and the "L" level of the signal Z corresponds to negation. The "L" level of the signal BZ corresponds to assertion, and the "H" level of the signal Z corresponds to negation.

In the following description, the notation NB means A or B. For example, "X includes A/B, C/D and E" includes the case "X includes A, C and E" and "X includes B, D and E".

An object of an embodiment of the present invention is to speed up a read operation in a memory system.

1. First Embodiment

A memory system according to a first embodiment is described with reference to FIGS. 1 to 16. The memory system according to the first embodiment includes, for example, a NAND-type flash memory as a semiconductor storage device and a memory controller which controls the NAND-type flash memory.

1-1. Overall Configuration of the Memory System

The overall configuration of the memory system according to the first embodiment is described with reference to FIGS. 1 and 2. A memory system 1 communicates with, for example, an external host device (not illustrated). The memory system 1 holds data received from the host device and transmits data which is read from the semiconductor storage devices 5 to 8 to the host device.

FIG. 1 is a diagram for explaining a power supply system of the memory system according to the first embodiment. As shown in FIG. 1, the memory system 1 includes a memory controller 2, a NAND package 3, a power manager 4 and a reference resistance 9. The NAND package 3 includes, for example, a plurality of semiconductor storage devices 5 to 8. In FIG. 1, four chips are included in the NAND package 3. In the following discussion, the semiconductor storage devices to 8 may be read as chips A to D, respectively.

The power manager 4 is an integrated circuit (IC) for managing the voltage to be supplied to the memory controller 2 and the NAND package 3. The power manager 4 supplies, for example, a voltage VCCQ to the memory controller 2 and the NAND package 3. The voltage VCCQ is used as a reference of the voltage that is used for an input/output signal between the memory controller 2 and the NAND package 3. In addition, the power manager 4 supplies, for example, a voltage VCC to the NAND package 3. The voltage VCC is used as a reference voltage of other voltages used in the NAND package 3.

In addition, the NAND package 3 is connected to a voltage VSS via the reference resistor 9. The reference resistor 9 is used, for example, to calibrate an output impedance of each of the semiconductor storage devices 5 to 8 in the NAND package 3. The voltage VSS is a ground voltage, and is defined as, for example, ground (0V) in the memory system 1.

Figure 2:
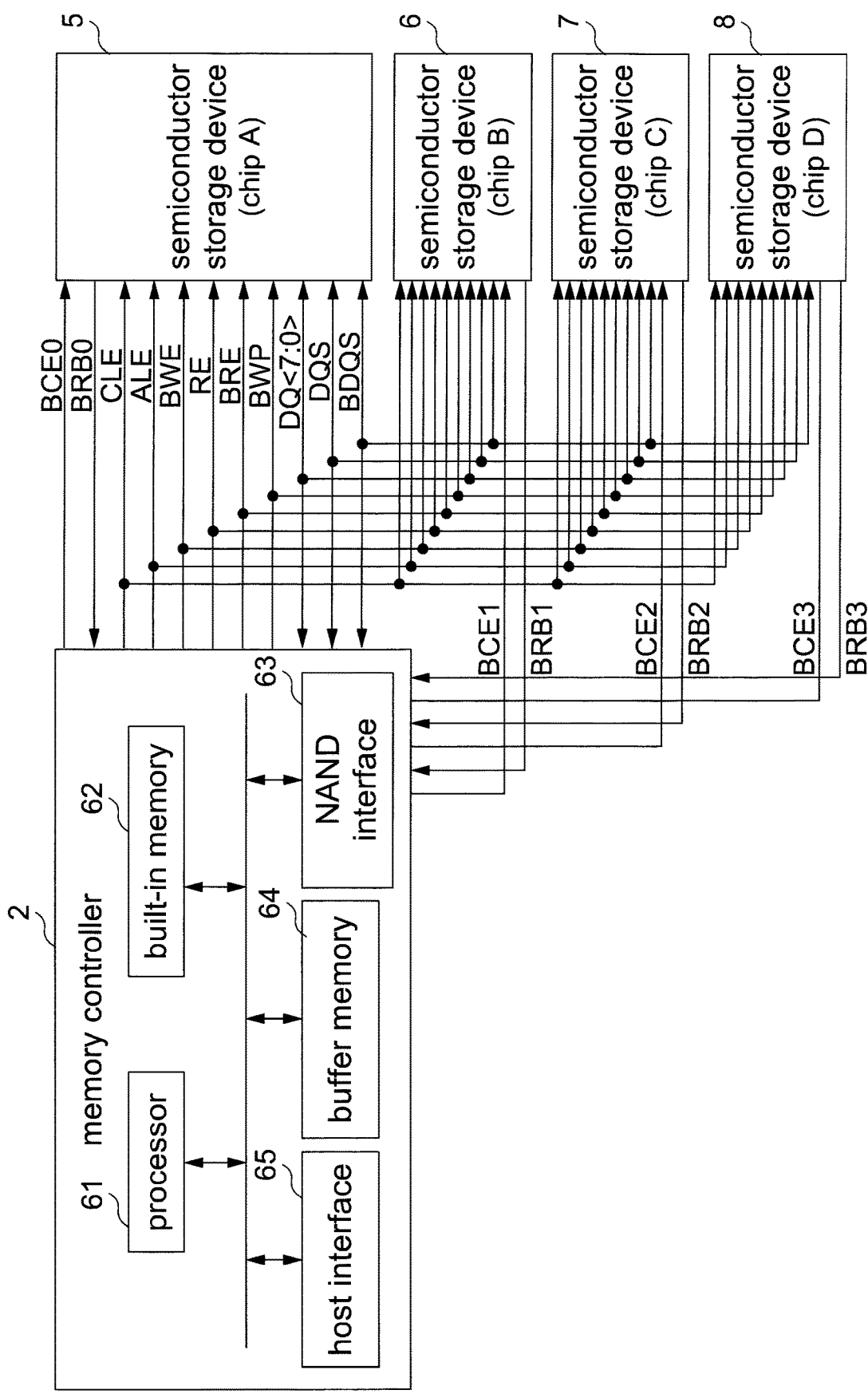
FIG. 2 is a block diagram illustrating a signal system of a memory system according to an embodiment.

FIG. 2 is a block diagram for explaining a configuration of a signal system of a memory system according to an embodiment. As shown in FIG. 2, the memory controller 2 controls the semiconductor storage devices 5 to 8. Specifically, the memory controller 2 writes data to the semiconductor storage devices 5 to 8 and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells and stores data in a non-volatile manner. Each the semiconductor storage devices 5 to 8 is a semiconductor chip that can be uniquely identified, for example, by being supplied with an individual chip enable signal or by being pre-assigned with an individual chip address. Therefore, each of the semiconductor storage devices 5 to 8 can be operated independently according to instructions of the memory controller 2.

Similar signals are transmitted and received on the NAND bus connected to each of the semiconductor storage devices 5 to 8. The NAND bus includes a plurality of signal lines to transmit and receive signals according to a NAND interface. BCE is a chip enable signal and operates in negative logic. BRB is a ready busy signal and operates in negative logic. CLE is a command latch enable signal and operates in positive logic. ALE is an address latch enable signal and operates in positive logic. BWE is a write enable signal and operates in negative logic. RE and BRE are read enable signals and inverted signals of them. The RE operates in positive logic. The BRE operates in negative logic. For example, the RE and/or BRE function as output instruction signals. BWP is a write protect signal and operates in negative logic.

DQ<7:0> is a data signal. The data signal DQ<7:0> is input and output via the input/output terminal (I/O port). Signals DQS and BDQS are a data strobe signal and an inverted signal of the data strobe signal. For example, the DQS and/or the BDQS function as the strobe signal or a timing control signal. The strobe signal (DQS/BDQS) is a signal pair having opposite phases. The strobe signal is a signal defining timing of transmitting and receiving the data signal DQ<7:0>. Signals BCE0 to BCE3 are transmitted from the memory controller 2 to each of the storage devices 5 to 8 independently. Signals BRB0 to BRB3 are transmitted independently from each of the semiconductor storage devices 5 to 8 to the memory controller 2. The signals CLE, ALE, BWE, RE, BRE and BWP are commonly transmitted from the memory controller 2 to the semiconductor storage devices 5 to 8.

The signals BCE0 to BCE3 are signals for enabling the semiconductor storage devices 5 to 8, respectively. The signal CLE notifies the semiconductor storage devices 5 to 8 that the data signals DQ<7:0> flowing to the semiconductor storage devices 5 to 8 are commands while the signal CLE is at the "high (H)" level. The signal ALE notifies the semiconductor storage devices 5 to 8 that the data signals DQ<7:0> flowing to the semiconductor storage devices 5 to 8 are addresses while the signal ALE is at the "H" level. The signal BWE instructs the semiconductor storage devices 5 to 8 to write the data signals DQ<7:0> flowing to the semiconductor storage devices 5 to 8 while the signal BWE is at the "low (L)" level.

The signals RE and BRE instruct the semiconductor storage devices 5 to 8 to output the data signals DQ<7:0>, and for example, are used to control the operation timing of the semiconductor storage devices 5 to 8 when outputting the data signals DQ<7:0>. The signal BWP instructs the semiconductor storage devices 5 to 8 to prohibit data writing and erasing. The signals BRB0 to BRB3 respectively indicate whether the semiconductor storage devices 5 to 8 are in a ready state (a state of accepting a command from the outside) or in a busy state (a state of not accepting a command from the outside).

The data signals DQ<7:0> are, for example, 8-bit signals. The data signals DQ<7:0> are transmitted and received between the semiconductor storage devices 5 to 8 and the memory controller 2, and include commands, addresses, and data. The signals DQS and BDQS may be generated, for example, based on the signals RE and BRE, and are used to control the operation timing of the semiconductor storage devices 5 to 8 in response to the data signals DQ<7:0>.

The memory controller 2 includes a processor (central processing unit (CPU)) 61, a built-in memory (random access memory (RAM)) 62, a NAND interface circuit 63, a buffer memory 64 and a host interface circuit 65.

The processor 61 controls the overall operation of the memory controller 2. The processor 61 issues, for example, a write command based on a NAND interface to the semiconductor storage devices 5 to 8 in response to a write command of data received from the outside. This function is equally applied to other operations such as, for example, read, erasing and calibration operations.

The built-in memory 62 is, for example, a semiconductor memory such as, for example, dynamic RAM (DRAM), and is used as a work area of the processor 61. The built-in memory 62 holds, for example, firmware and various management tables for managing the semiconductor storage devices 5 to 8.

The NAND interface circuit 63 is connected to the semiconductor storage devices 5 to 8 via the above-described NAND bus, and executes communication with the semiconductor storage devices 5 to 8. The NAND interface circuit 63 transmits commands, addresses, and write data to the semiconductor storage devices 5 to 8 in response to an instruction of the processor 61. In addition, the NAND interface circuit 63 receives statuses and read data from the semiconductor storage devices 5 to 8.

The buffer memory 64 temporarily holds, for example, data received by the memory controller 2 from the semiconductor storage devices 5 to 8 and the outside.

The host interface circuit 65 is connected to an external host device (not illustrated), and executes communication with the host device. The host interface circuit 65 transfers, for example, commands and data, received from the host device to the processor 61 and the buffer memory 64, respectively.

[1-2. Configuration of the Semiconductor Storage Device]

The configuration of the semiconductor storage device according to the first embodiment is described with reference to FIG. 3. The semiconductor storage devices 5 to 8 have, for example, the same configuration. Therefore, in the following description, a configuration of the semiconductor storage device 5, among the semiconductor storage devices 5 to 8, is described, and a description related to a configuration of the semiconductor storage devices 6 to 8 is omitted.

Figure 3:
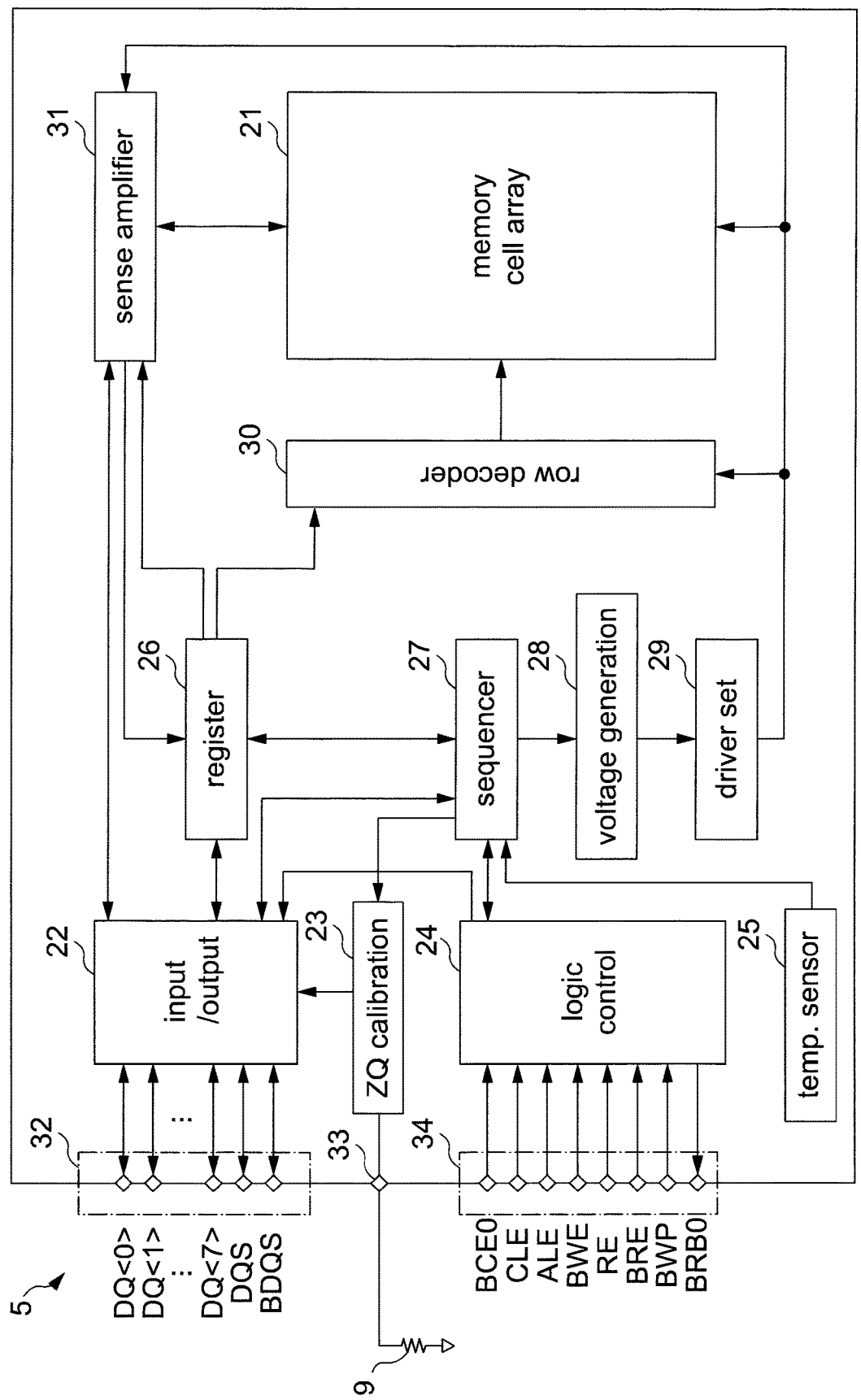
FIG. 3 is a block diagram illustrating a configuration of a semiconductor storage device according to an embodiment.

As illustrated in FIG. 3, the semiconductor storage device 5 includes a memory cell array 21, an input/output circuit 22, a ZQ calibration circuit 23, a logic control circuit 24, a temperature sensor 25 (temp. sensor), a register 26, a sequencer 27, a voltage generation circuit 28, a driver set 29, a row decoder 30, a sense amplifier 31, an input/output pad group 32, a ZQ calibration pad 33 and a logic-control pad group 34.

The memory cell array 21 includes a plurality of nonvolatile memory cells (not illustrated) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE and BWP from the memory controller 2. In addition, the logic control circuit 24 transfers the signal BRB0 to the memory controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. In addition, the sequencer 27 sends information on the temperature, received from the temperature sensor 25, to the memory controller 2 via the input/output circuit 22.

The voltage generation circuit 28 generates voltages required for operations such as, for example, data writing, reading and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. In addition, the sense amplifier 31 receives a column address, among the addresses, from the register 26, and outputs column data based on the column address.

The input/output pad group 32 transfers the data signal DQ<7:0>, the signal DQS and the signal BDQS, received from the memory controller 2, to the input/output circuit 22. In addition, the input/output pad group 32 transfers the data signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic control pad group 34 transfers signals BCE0, CLE, ALE, BWE, RE, BRE and BWP received from the memory controller 2 to the logic control circuit 24. The logic control pad group 34 transfers BRB0 transmitted from the logic control circuit 24 to the exterior of the semiconductor storage device 5.

[1-3. Configuration of Memory Cell Array 21]

[1-3-1. Circuit Configuration of Memory Cell Array 21]

Figure 4:
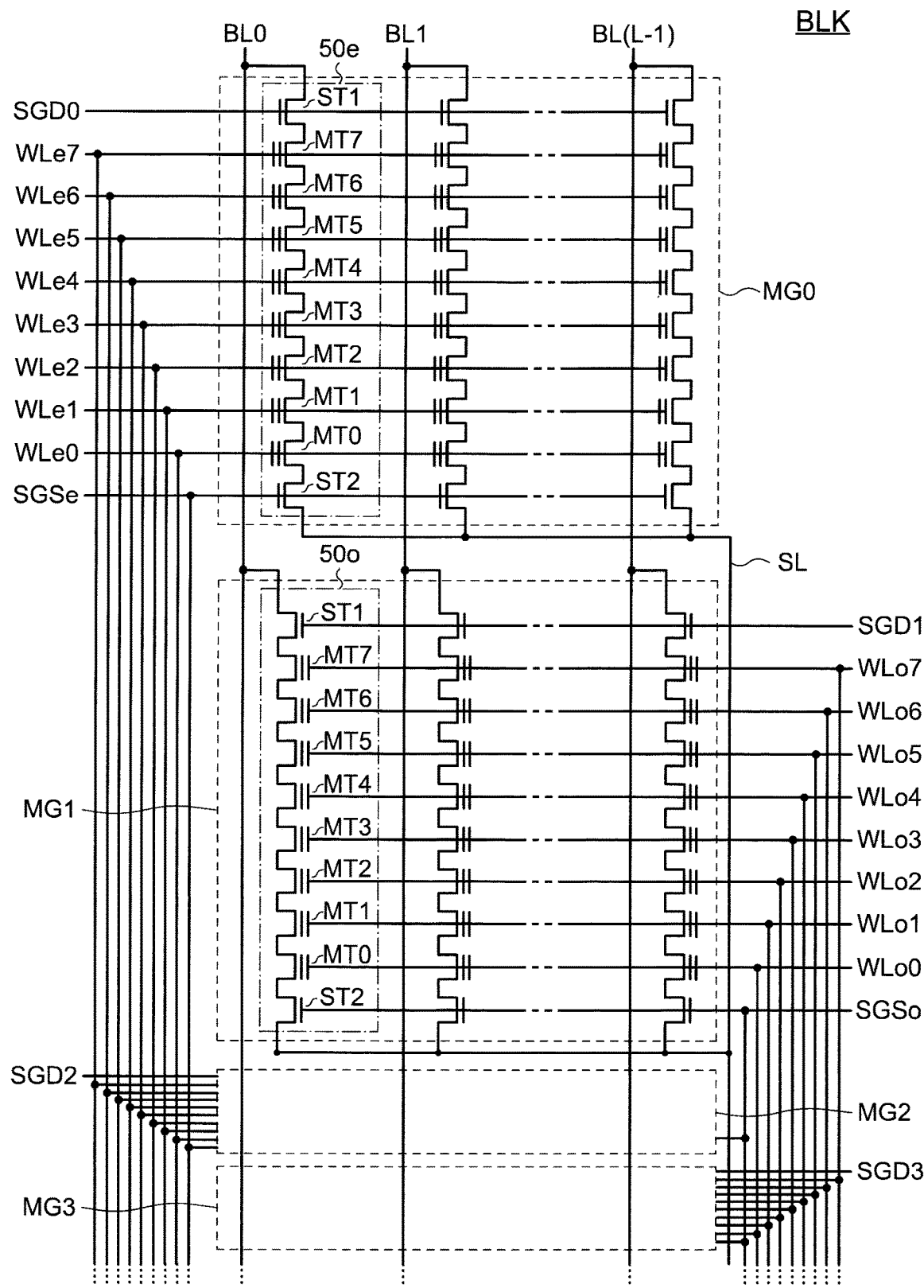
FIG. 4 is a diagram illustrating a circuit configuration of a memory cell array of a semiconductor storage device according to an embodiment.

The circuit configuration of the memory cell array 21 will be described with reference to FIG. 4. FIG. 4 is an equivalent circuit diagram of a block BLK. As shown in FIG. 4, the block BLK includes a plurality of memory groups MG (MG0, MG1, MG2, . . . ). Each memory group MG includes a plurality of NAND strings 50. In the following description, a NAND string of an even-numbered memory group MGe (MG0, MG2, MG4, . . . ) is referred to as a NAND string 50e. A NAND string of an odd-numbered memory group MGo (MG1, MG3, MG5, . . . ) is referred to as a NAND string 50o.

Each of the NAND strings 50 includes, for example, eight memory cell transistors MT (MT0 to MT7) and select transistors ST1 and ST2. The memory cell transistor MT includes a control gate and a charge storage layer. The memory cell transistor MT has a threshold voltage and is in an on-state when a voltage equal to or higher than the threshold voltage is applied to the control gate. When a write operation to the memory cell transistor MT is performed, the threshold voltage of the memory cell transistor MT varies. That is, the threshold voltage of the memory cell transistor MT varies when electrons are injected into the charge storage layer of the memory cell transistor MT. The threshold voltage of the memory cell transistor MT in a state where electrons are injected into the charge storage layer is higher than the threshold voltage of the memory cell transistor MT in a state where no electrons are injected into the charge storage layer. The memory cell transistor MT holds data in a non-volatile manner by variations of the threshold voltage due to the injection of electrons into the charge storage layer. The eight memory cell transistors MT are connected in series between a source of the select transistor ST1 and a drain of the select transistor ST2.

Gates of the select transistor ST1 in each of the memory groups MG are connected to select gate lines SGD (SGD0, SGD1, . . . ) respectively. Each select gate line SGD is independently controlled by the row decoder 30. A gate of the select transistor ST2 in each of the even-numbered memory groups MGe (MG0, MG2, . . . ) are commonly connected to a select gate line SGSe. A gate of the select transistor ST2 in each of the odd-numbered memory groups MGo (MG1, MG3, . . . ) are commonly connected to a select gate line SGSo. The select gate lines SGSe and SGSo may be commonly connected or independently controllable.

The control gates of the memory cell transistors MT (MT0 to MT7) included in the memory group MGe in the same block BLK are commonly connected to word lines WLe (WLe0 to WLe7), respectively. On the other hand, the control gates of the memory cell transistors MT (MT0 to MT7) included in the memory group MGo are commonly connected to word lines WLo (WLo0 to WLo7), respectively. The word lines WLe and WLo are independently controlled by the row decoder 30.

The block BLK is, for example, an erasure unit of data. That is, data held by the memory cell transistors MT included in the same block BLK are collectively erased. The threshold voltage of the memory cell transistor MT in an erased state is lower than the threshold voltage of the memory cell transistor MT in a written state.

In the memory cell array 21, the drains of the select transistors ST1 included in the NAND strings 50 provided in the same column are commonly connected to a bit line BL (BL0 to BL(L−1)). L is a natural number of 2 or more. That is, the bit lines BL are commonly connected to the NAND strings 50 between the plurality of memory groups MG. In the memory cell array 21, the sources of the plurality of select transistors ST2 are commonly connected to a source line SL.

The memory group MG includes the plurality of NAND strings 50. The plurality of NAND strings 50 are connected to different bit lines BL and connected to the same select gate line SGD. The block BLK includes the plurality of memory groups MG sharing the word line WL. The memory cell array 21 includes a plurality of blocks BLK sharing the bit line BL. In the memory cell array 21, the select gate line SGS, the word line WL, and the select gate line SGD are stacked above a semiconductor substrate so that the memory cell transistor MT is stacked in three dimensions.

[1-3-2. Planar Layout of Memory Cell Array 21]

Figure 5:
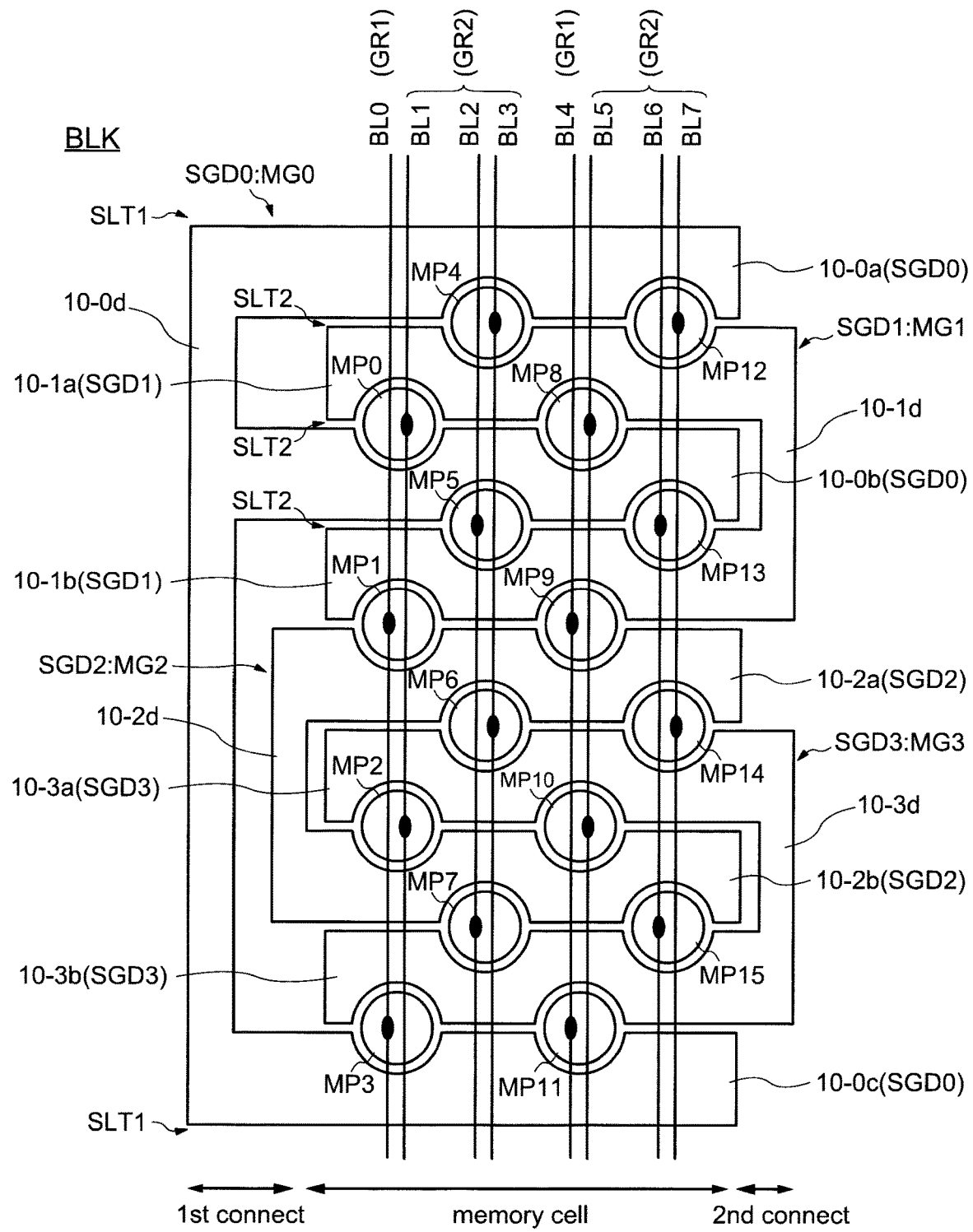
FIG. 5 is a diagram illustrating a layout of select gate lines, bit lines, and memory pillars of a semiconductor storage device according to an embodiment.

A planar configuration of the memory cell array 21 will be described with reference to FIG. 5. FIG. 5 shows a planar layout of the select gate line SGD in a semiconductor substrate plane (X-Y plane) of a certain block BLK. In the present embodiment, a configuration in which four select gate lines SGD are included in one block BLK is described.

As shown in FIG. 5, wiring layers 10-0a, 10-0b, 10-0c having a longitudinal in the X-direction are connected by a first connecting section 10-0d (1st connect) having a longitudinal in the Y-direction. The two wiring layers 10-0a, 10-0c are provided at both ends in the Y-direction. The wiring layers 10-0a, 10-0b are adjacent to each other in the Y-direction with the other one wiring layer (a wiring layer 10-1a) interposed therebetween. The first connecting section 10-0d is provided at the first end in the X-direction. Three wiring layers 10-0a, 10-0b, 10-0c function as the select gate line SGD0.

The wiring layers 10-1a, 10-1b having the longitudinal in the X-direction are connected by a second connecting section 10-1d (2nd connect) having the longitudinal in the Y-direction. The wiring layer 10-1a is provided between the wiring layers 10-0a, 10-0b. The wiring layer 10-1b is provided between the wiring layer 10-0b and the other one wiring layer (a wiring layer 10-2a). The second connecting section 10-1d is provided on the second end which is the opposite side of the first connecting section 10-0d in the X-direction. The two wiring layers 10-1a, 10-1b function as the select gate line SGD1.

The wiring layers 10-2a, 10-2b having the longitudinal in the X-direction are connected by a first connecting section 10-2d having the longitudinal in the Y-direction. Similarly, wiring layers 10-3a, 10-3b having the longitudinal in the X-direction are connected by a second connecting section 10-3d having the longitudinal in the Y-direction. The wiring layer 10-2a is provided between the wiring layer 10-1b and the wiring layer 10-3a. The wiring layer 10-3a is provided between the wiring layer 10-2a and the wiring layer 10-2b. The wiring layer 10-2b is provided between the wiring layer 10-3a and the wiring layer 10-3b. The wiring layer 10-3b is provided between the wiring layer 10-2b and the wiring layer 10-0c. The first connecting section 10-2d is provided at a first end in the X-direction. The second connecting section 10-3d is provided at a second end in the X-direction. In the X-direction, the first end is an end portion on the same side as the first connecting section 10-0d, the second end is an end portion on the opposite side of the first connecting section 10-0d. The two wiring layers 10-2a, 10-2b function as the select gate line SGD2. The two wiring layers 10-3a, 10-3b function as the select gate line SGD3.

In the present embodiment, a configuration in which each wiring layer is connected by the first connecting sections 10-0d, 10-2d, or the second connecting sections 10-1d, 10-3d is exemplified but is not limited to this configuration. For example, each wiring layer may be independent and controlled so that the same voltage is supplied to the wiring layers 10-0a, 10-0b, 10-0c, the same voltage is supplied to the wiring layers 10-1a, 10-1b, the same voltage is supplied to the wiring layers 10-2a, 10-2b, and the same voltage is supplied to the wiring layers 10-3a, 10-3b.

A group including a memory pillar MP adjacent to the wiring layers 10-0a, 10-0b, 10-0c is referred to as the memory group MG0. A group including the memory pillar MP adjacent to the wiring layers 10-1a, 10-1b is referred to as the memory group MG1. A group including the memory pillar MP adjacent to the wiring layers 10-2a, 10-2b is referred to as the memory group MG2. A group including the memory pillar MP adjacent to the wiring layers 10-3a, 10-3b is referred to as the memory group MG3.

The wiring layers 10 adjacent to each other in the Y-direction in the block BLK are insulated. An area that insulates the adjacent wiring layers 10 is referred to as a slit SLT2. In the slit SLT2, for example, an insulation layer is embedded in an area from a surface of the semiconductor substrate to a layer where at least the wiring layer 10 is provided. In the memory cell array 21, for example, the plurality of blocks BLK shown in FIG. 5 is arranged, in the Y-direction. Between the blocks BLK adjacent to each other in the Y-direction is also insulated in the same manner as described above. An area that insulates the adjacent blocks BLK is referred to as a slit SLT1. The slit SLT1 has the same configuration as the slit SLT2.

The plurality of memory pillars MP (MP0 to MP15) is provided between the wiring layers 10 adjacent to each other in the Y-direction. Each of the plurality of memory pillars MP has the longitudinal in the Z-direction. The Z-direction is a direction orthogonal (or intersecting) to the X-Y direction, i.e., a direction orthogonal to the surface of the semiconductor substrate. The plurality of memory pillars MP is provided in a memory cell section (memory cell).

Specifically, the memory pillars MP4, MP12 are provided between the wiring layers 10-0a, 10-1a. The memory pillars MP0, MP8 are provided between the wiring layers 10-1a, 10-0b. The memory pillars MP5, MP13 are provided between the wiring layers 10-0b, 10-1b. The memory pillars MP1, MP9 are provided between the wiring layers 10-1b, 10-2a. The memory pillars MP6, MP14 are provided between the wiring layers 10-2a, 10-3a. The memory pillars MP2, MP10 are provided between the wiring layers 10-3a, 10-2b. The memory pillars MP7, MP15 are provided between the wiring layers 10-2b, 10-3b. The memory pillars MP3, MP11 are provided between the wiring layers 10-3b, 10-0c.

The memory pillar MP is a structure body in which the select transistors ST1, ST2, and the memory cell transistor MT are formed. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. In other words, the memory pillars MP0 to MP3 and the memory pillars MP8 to MP11 are arranged in parallel.

The memory pillars MP4 to MP7 and MP12 to MP15 are arranged along the Y-direction. The memory pillars MP4 to MP7 are located between the memory pillars MP0 to MP3 and the memory pillars MP8 to MP11 in the X-direction. The memory pillars MP12 to MP15 are arranged along the Y-direction at positions adjacent to the memory pillars MP4 to MP7 in the X-direction. In other words, the memory pillars MP4 to MP7 and the memory pillars MP12 to MP15 are arranged in parallel.

Two bit lines BL0, BL1 are provided above the memory pillars MP0 to MP3. The bit line BL0 is commonly connected to the memory pillars MP1, MP3. The bit line BL1 is commonly connected to the memory pillars MP0, MP2. Two bit lines BL2, BL3 are provided above the memory pillars MP4 to MP7. The bit line BL2 is commonly connected to the memory pillars MP5, MP7. The bit line BL3 is commonly connected to the memory pillars MP4, MP6.

Two bit lines BL4, BL5 are provided above the memory pillars MP8 to MP11. The bit line BL4 is commonly connected to the memory pillars MP9, MP11. The bit line BL5 is commonly connected to the memory pillars MP8, MP10. Two bit lines BL6, BL7 are provided above the memory pillars MP12 to MP15. The bit line BL6 is commonly connected to the memory pillars MP13, MP15. The bit line BL7 is commonly connected to the memory pillars MP12, MP14.

In the present embodiment, in the Y-direction, the positions of each of the memory pillars MP0 to MP3, MP8 to MP11 are shifted by ½ of a distance between the memory pillars MP with respect to the positions of each of the memory pillars MP4 to MP7, MP12 to MP15.

The memory pillars MP are provided between two adjacent wiring layers 10 in the Y-direction, and are provided so as to be embedded in a part of any of the slits SLT2, and there is one slit SLT2 between the memory pillars adjacent in the Y-direction.

Although the details will be described later, the bit line BL0 connected to the memory pillars MP1, MP3 and the bit line BL4 connected to the memory pillars MP9, MP11 may be referred to as a first group GR1. The bit lines BL1 to BL3 connected to the memory pillars MP0, MP2, MP4 to MP7 and the bit lines BL5 to BL7 connected to the memory pillars MP8, MP10, MP12 to MP15 may be referred to as a second group GR2.

The memory pillar MP is not provided in an area between the wiring layers 10-0a and 10-0c adjacent to each other with the slit SLT1 interposed therebetween. However, from the viewpoint of process stability, the area may be provided with a dummy memory pillar MP which is not connected to the BL.

Figure 6:
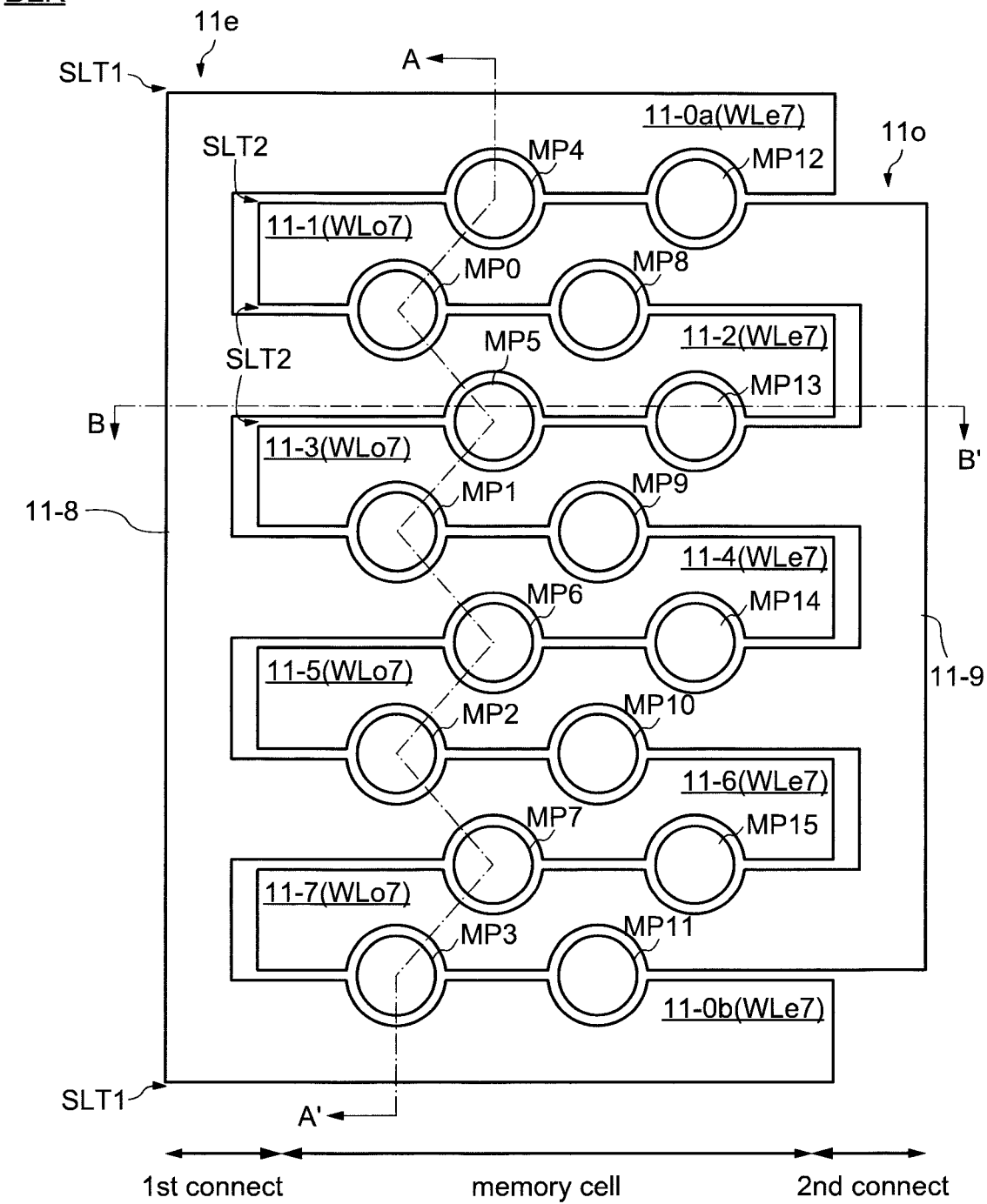
FIG. 6 is a diagram illustrating a layout of word lines and memory pillars of a semiconductor storage device according to an embodiment.

FIG. 6 shows a planar layout of the word lines WL in the X-Y plane, similar to FIG. 5. FIG. 6 corresponds to one block of the area of FIG. 5 and is a layout of wiring layers 11 provided in a lower layer than the wiring layer 10 described in FIG. 5.

As shown in FIG. 6, the nine wiring layers 11 (11-0a, 11-0b, 11-1 to 11-7) extending in the X-direction are arranged along the Y-direction. Each wiring layer 11-0a, 11-0b, 11-1 to 11-7 is provided in the lower layer of the wiring layers 10-0 to 10-7 via an insulation layer.

Each wiring layer 11 functions as a word line WL7. Other word lines WL0 to WL6 have the same configuration and function as the word line WL7. As shown in FIG. 6, the wiring layers 11-0a, 11-2, 11-4, 11-6, 11-0b functioning as the word line WLe7 having the longitudinal in the X-direction, respectively, are arranged side by side in the Y-direction. The wiring layers 11-0a, 11-2, 11-4, 11-6, 11-0b are connected by a first connecting section 11-8 (1st connect) having the longitudinal in the Y-direction. The first connecting section 11-8 is provided at the first end in the X-direction. The wiring layers 11-0a, 11-2, 11-4, 11-6, 11-0b are connected to the row decoder 30 via the first connecting section 11-8. The first connecting section 11-8 and the wiring layers 11-0a, 11-2, 11-4, 11-6, 11-01D may be collectively referred to as a wiring layer 11e.

The Wiring layers 11-1, 11-3, 11-5, 11-7 functioning as the word line WLo7 have the longitudinal in the X-direction, respectively, and are arranged side by side in the Y-direction. These wiring layers 11-1, 11-3, 11-5, 11-7 are connected by a second connecting section 11-9 having the longitudinal in the Y-direction. The second connecting section 11-9 (2nd connect) is provided at the second end that is an end portion opposite to the first end of the first connecting section 11-8 in the X-direction. The wiring layers 11-1, 11-3, 11-5, 11-7 are connected to the row decoder via the second connecting section 11-9. The second connecting section 11-9 and the wiring layers 11-1, 11-3, 11-5, 11-7 may be collectively referred to as a wiring layer 11o.

The memory cell section (memory cell) is provided between the first connecting section 11-8 and the second connecting section 11-9. A portion of the memory cell section facing the wiring layer 11e is referred to as a "first memory cell section", and a portion of the memory cell section facing the wiring layer 11O may be referred to as a "second memory cell section". In the memory cell section, the wiring layers 11 adjacent to each other in the Y-direction are separated by the slit SLT2 described with reference to FIG. 5. The wiring layers 11 between the blocks BLK adjacent to each other in the Y-direction are also separated by the slit SLT1 as described in FIG. 5. In the memory cell section, the memory pillars MP0 to MP15 are provided in the same manner as in FIG. 5.

The select gate line SGS and the word lines WL0 to WL6 have the same configuration as the word line WL7 of FIG. 6.

[1-3-3. Cross-Sectional Structure of Memory Cell Array 21]

Figure 7:
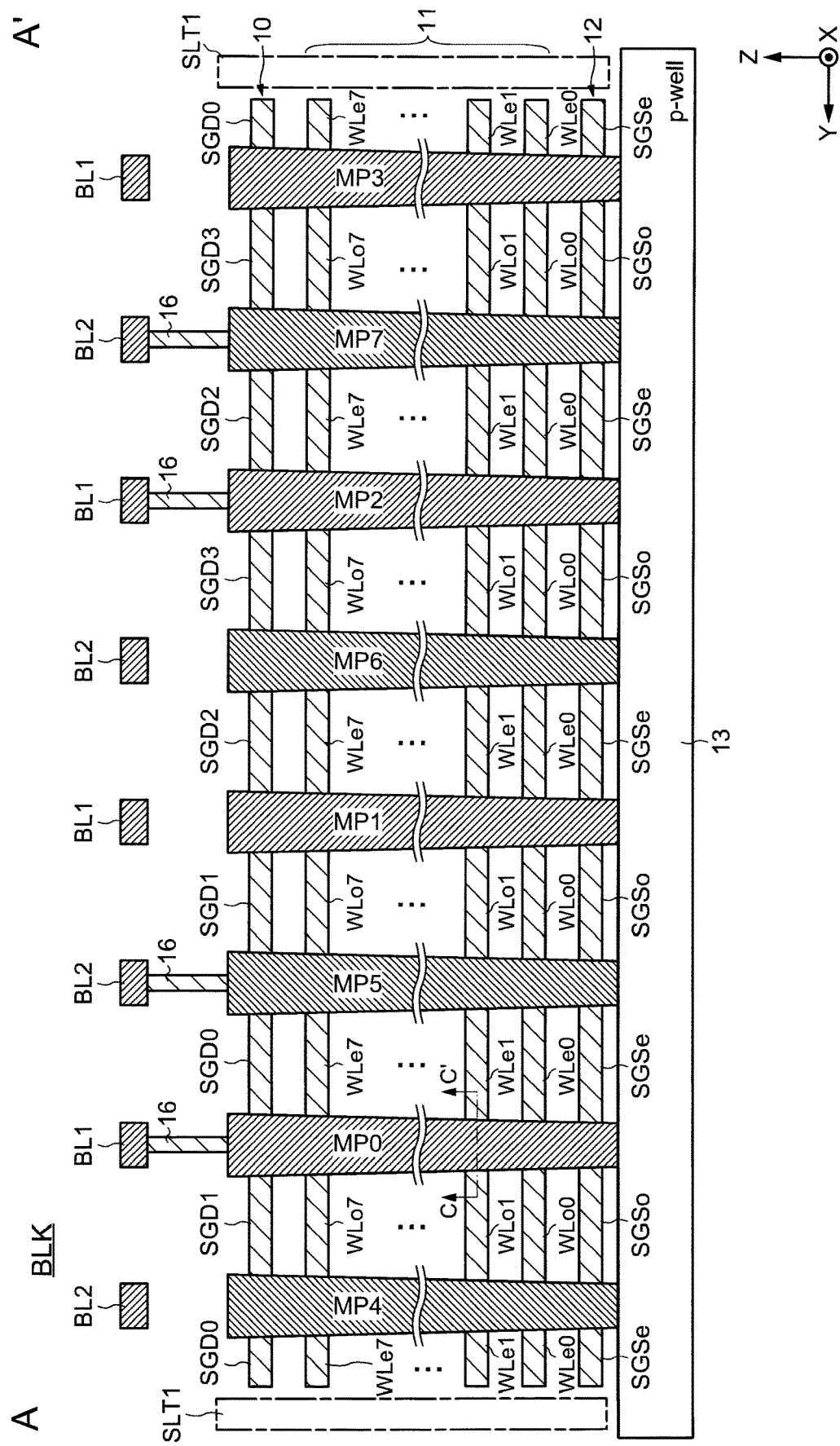
FIG. 7 is a A-A' cross-sectional view of the semiconductor storage device shown in FIG. 6.

The cross-sectional structure of the memory cell array 21 will be described with reference to FIG. 7. FIG. 7 is a A-A' cross-sectional view of the semiconductor storage device shown in FIG. 6.

As shown in FIG. 7, a wiring layer 12 functioning as the select gate line SGS is provided above a p-type well area (p-well) of a semiconductor substrate 13. Eight wiring layers 11 functioning as the word lines WL0 to WL7 are stacked along the Z-direction above the wiring layer 12. The planar layout of the wiring layers 11, 12 is similar to the layout shown in FIG. 6. The wiring layer 10 functioning as the select gate line SGD is provided above the wiring layer 11. The planar layout of the wiring layer 10 is the layout shown in FIG. 5.

The wiring layer 12 functions as the select gate line SGSo or the select gate line SGSe. The select gate lines SGSo, SGSe are alternately arranged in the Y-direction. The memory pillar MP is provided between the select gate lines SGSo, SGSe adjacent to each other in the Y-direction.

The wiring layer 11 functions as the word line WLo or the word line WLe. The word lines WLo and WLe are alternately arranged in the Y-direction. The memory pillar MP is provided between the word lines WLo, WLe adjacent to each other in the Y-direction. A memory cell described later is provided between the memory pillar MP and the word line WLo and between the memory pillar MP and the word line WLe.

The slit SLT1 is provided between the blocks BLK adjacent to each other in the Y-direction. As described above, the slit SLT1 is provided with an insulation layer. However, a contact plug or the like for supplying a voltage to an area provided in the semiconductor substrate 13 may be provided in the slit SLT1. For example, a contact plug or groove-shaped conductor for connecting the source of the select transistor ST2 to the source line may be provided in the slit SLT1.

The bit lines BL1, BL2 are provided on the memory pillar MP. A contact plug 16 for connecting each memory pillar MP and the bit line BL is provided between the memory pillar MP0 and the bit line BL1 and between the memory pillar MP2 and the bit line BL1. Similarly, the contact plug 16 for connecting each memory pillar MP and the bit line BL is provided between the memory pillar MP5 and the bit line BL2 and between the memory pillar MP7 and the bit line BL2. The other memory pillars MP are connected to the bit line BL1 or the bit line BL2 through the contact plug 16 in an area other than the cross section shown in FIG. 7.

Figure 8:
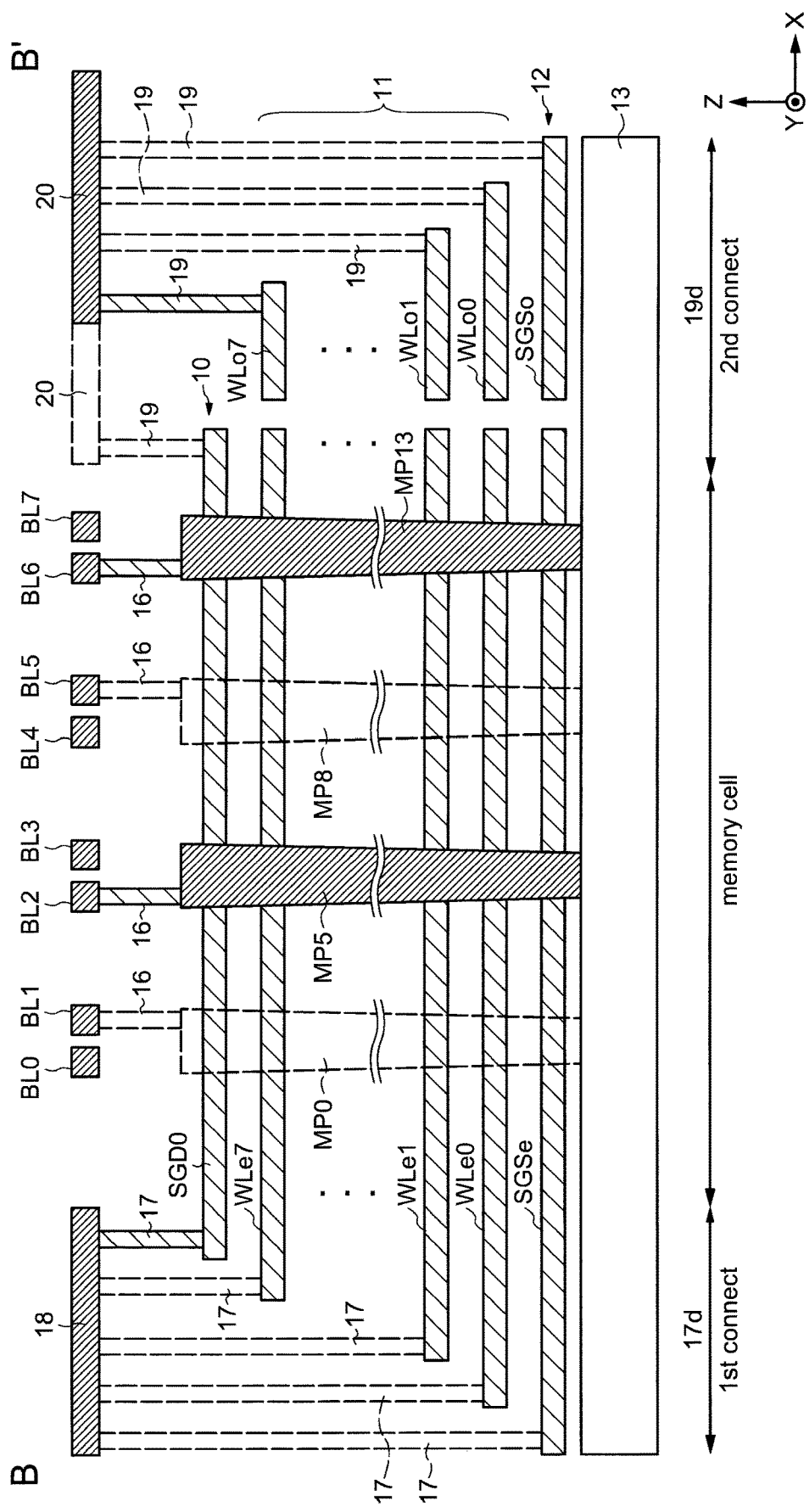
FIG. 8 is a B-B' cross-sectional view of the semiconductor storage device shown in FIG. 6.

FIG. 8 is a B-B' cross-sectional view of the semiconductor storage device shown in FIG. 6. As described in an explanation of FIG. 7, the wiring layers 12, 11, are provided sequentially above the semiconductor substrate 13. In FIG. 8, the configuration existing in the depth direction of the B-B' cross-sectional view is drawn by a dotted line.

In a first connecting section 17d (1st connect), the wiring layers 11, 12 are formed in a stepped shape. That is, when viewed in the X-Y plane, each end portion of the eight wiring layers 11 and the upper surface of the end portion of the wiring layer 12 are exposed in the first connecting section 17d. A contact plug 17 is provided in the wiring layers 11, 12 exposed at the first connecting section 17d. The contact plug 17 is connected to a metal wiring layer 18. The wiring layers 10 to 12 functioning as even select gate lines SGD0, SGD2, SGD4, SGD6, an even word line WLe, and an even select gate line SGSe, are electrically connected to the row decoder 30 via the metal wiring layer 18.

In a second connecting section 19d (2nd connect), similar to the above, the wiring layers 11, 12 are formed in a stepped shape. That is, when viewed in the X-Y plane, each end portion of the eight wiring layers 11 and the upper surface of the end portion of the wiring layer 12 are exposed in the second connecting section 19d. A contact plug 19 is provided in the wiring layers 11, 12 exposed at the second connecting section 19d. The contact plug 19 is connected to a metal wiring layer 20. The wiring layers 11, 12 functioning as odd select gate lines SGD1, SGD3, SGD5, SGD7, an odd word line WLo, and an odd select gate line SGSo are electrically connected to the row decoder 30 via the metal wiring layer 20.

The wiring layer 10 may be electrically connected to the row decoder 30 via the second connecting section 19d instead of the first connecting section 17d, and may be electrically connected to the row decoder 30 via both the first connecting section 17d and the second connecting section 19d.

[1-4. Structure of Memory Pillar and Memory Cell Transistor]

The structures of the memory pillar MP and the memory cell transistor MT will be described with reference to FIGS. 9 and 10.

1-4-1. First Example

The configurations of the memory pillar MP and the memory cell transistor MT according to a first example will be described with reference to FIGS. 9 and 10. FIG. 9 is a C-C' cross-sectional view of the memory cell shown in FIG. 7. FIG. 10 is a D-D' cross-sectional view of the memory cell shown in FIG. 9. In the first example, a floating gate type memory cell transistor MT is shown in which a conductive layer is used as the charge storage layer of the memory cell transistor MT.

Figure 9:
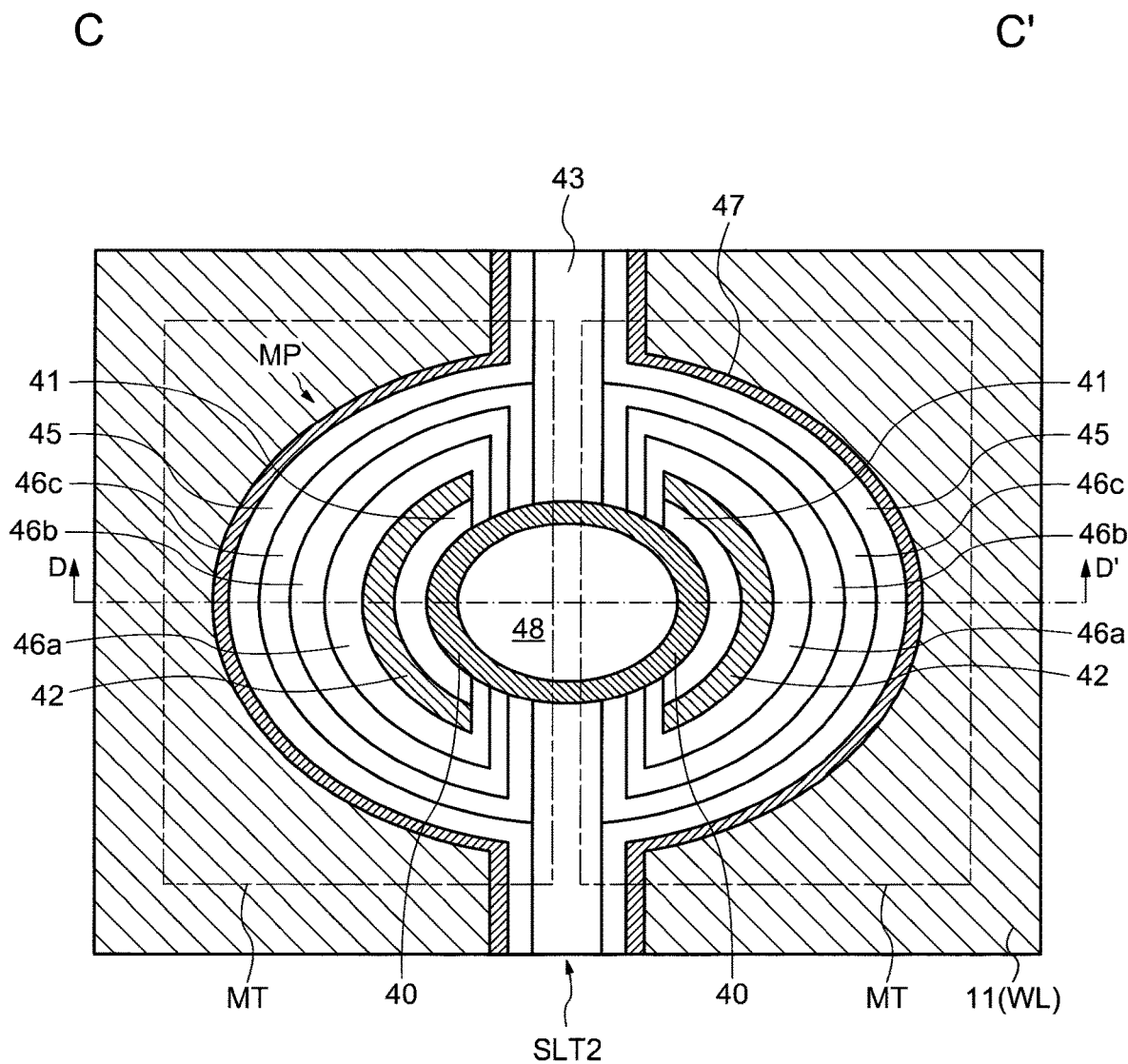
FIG. 9 is a C-C' cross-sectional view of the memory cell shown in FIG. 7.
Figure 10:
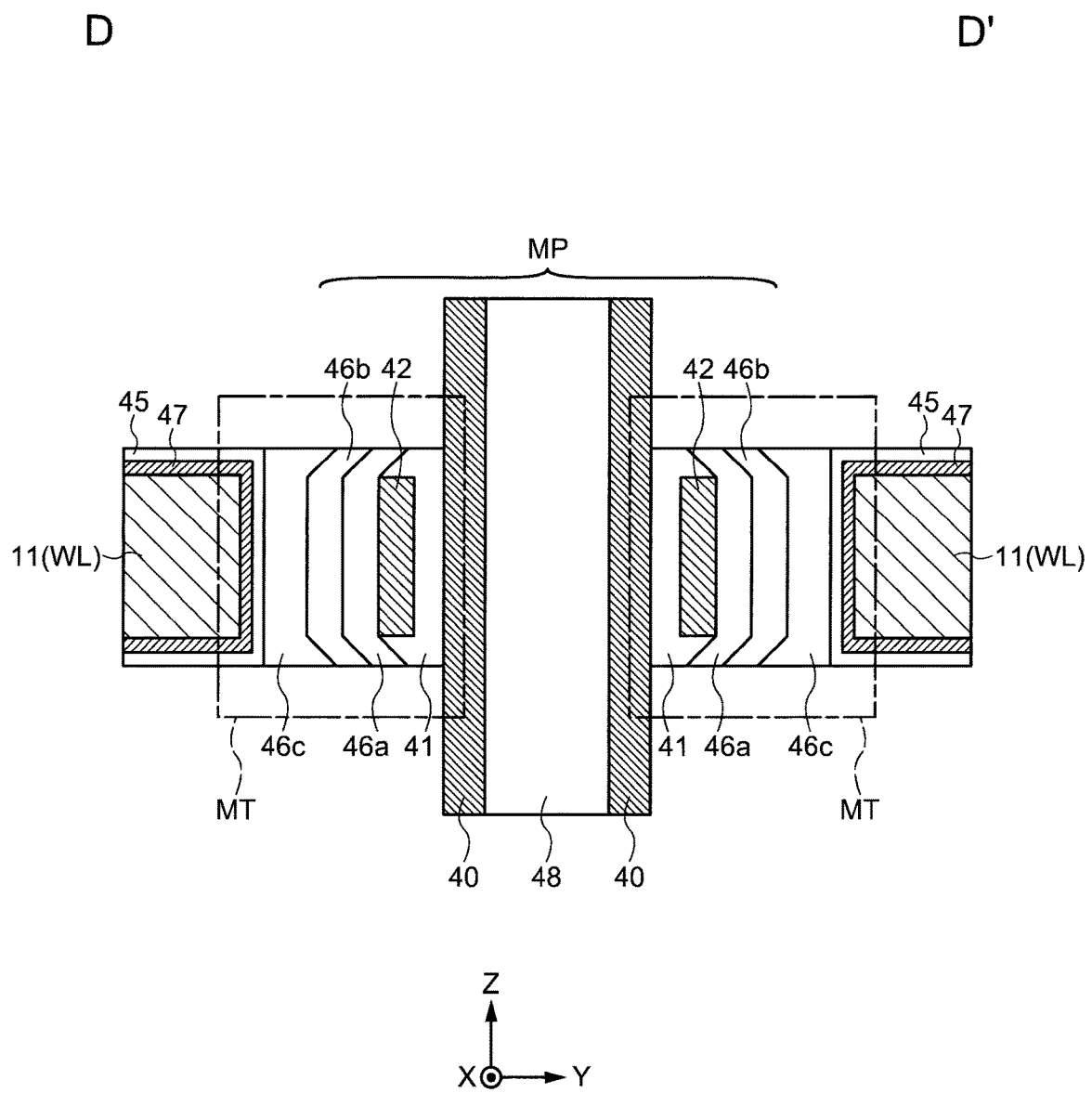
FIG. 10 is a D-D' cross-sectional view of the memory cell shown in FIG. 9.

As shown in FIGS. 9 and 10, the memory pillars MP include insulation layers 48, 43, a semiconductor layer 40, an insulation layer 41, a conductive layer 42, and insulation layers 46a to 46c provided along the Z-direction. The insulation layer 48 is, for example, a silicon oxide layer. The semiconductor layer 40 is provided to surround the periphery of the insulation layer 48. The semiconductor layer 40 is, for example, a polycrystalline silicon layer. The semiconductor layer 40 functions as a channel of the memory cell transistor MT. The semiconductor layer 40 is provided continuously between the two memory cell transistors MT included in one memory pillar MP and is not separated for each memory cell transistor MT.

As described above, the semiconductor layer 40 is continuous between the two memory cell transistors MT facing each other. Therefore, the two channels formed in the two memory cell transistors MT share a part of the memory pillar MP. Specifically, in FIG. 9, in the memory cell transistor MT on the left side and the memory cell transistor MT on the right side facing each other, the channel formed in the memory cell transistor MT on the left side and the channel formed in the memory cell transistor MT on the right side share a part of the memory pillar MP. The two channels share a part of the memory pillar MP means that the two channels are formed in the same memory pillar MP and that the two channels partially overlap. The above configuration may be referred to as that the two memory cell transistors MT share the channel or the two memory cell transistors MT face each other.

The insulation layer 41 is provided around the semiconductor layer 40 and functions as a gate insulation layer of each memory cell transistor MT. The insulation layer 41 is separated into two areas in the X-Y plane shown in FIG. 9. Each of the insulation layers 41 functions as the gate insulation layer of the two memory cell transistors MT included in one memory pillar MP. The insulation layer 41 is, for example, a stacked structure of the silicon oxide layer and the silicon nitride layer. The conductive layer 42 is provided around the insulation layer 41 and is separated into two areas along the Y-direction by the insulation layer 43. The conductive layer 42 is, for example, a polycrystalline silicon layer having conductivity. Each of the separated conductive layers 42 functions as the charge storage layer of the two memory cell transistors MT described above.

The insulation layer 43 is, for example, a silicon oxide layer. The insulation layers 46a, 46b, 46c are provided sequentially around the conductive layer 42. The insulation layers 46a, 46c are, for example, silicon oxide layers. The insulation layer 46b is, for example, a silicon nitride layer. The insulation layers function as block insulation layers of the memory cell transistor MT. The insulation layers 46a to 46b are also separated into two areas along the Y-direction. The insulation layer 43 is provided between the separated insulation layers 46a to 46b. The insulation layer 43 is embedded in the slit SLT2. The insulation layer 43 is, for example, a silicon oxide layer.

An AlO layer 45 is provided around the memory pillar MP having the above-described configuration, for example. A barrier metal layer 47 (TiN layer or the like) is provided around the AlO layer 45, for example. The wiring layer 11 functioning as the word line WL is provided around the barrier metal layer 47. The wiring layer 11 is, for example, tungsten.

According to the above configuration, two memory cell transistors MT are provided in one memory pillar MP along the Y-direction. The select transistors ST1 and ST2 also have the same configuration as described above. An insulation layer (not shown) is provided between the memory cell transistors adjacent to each other in the Z-direction. The conductive layer 42 is insulated for each individual memory cell transistor by the insulation layer and the insulation layers 43, 46.

1-4-2. Example 2

Figure 11:
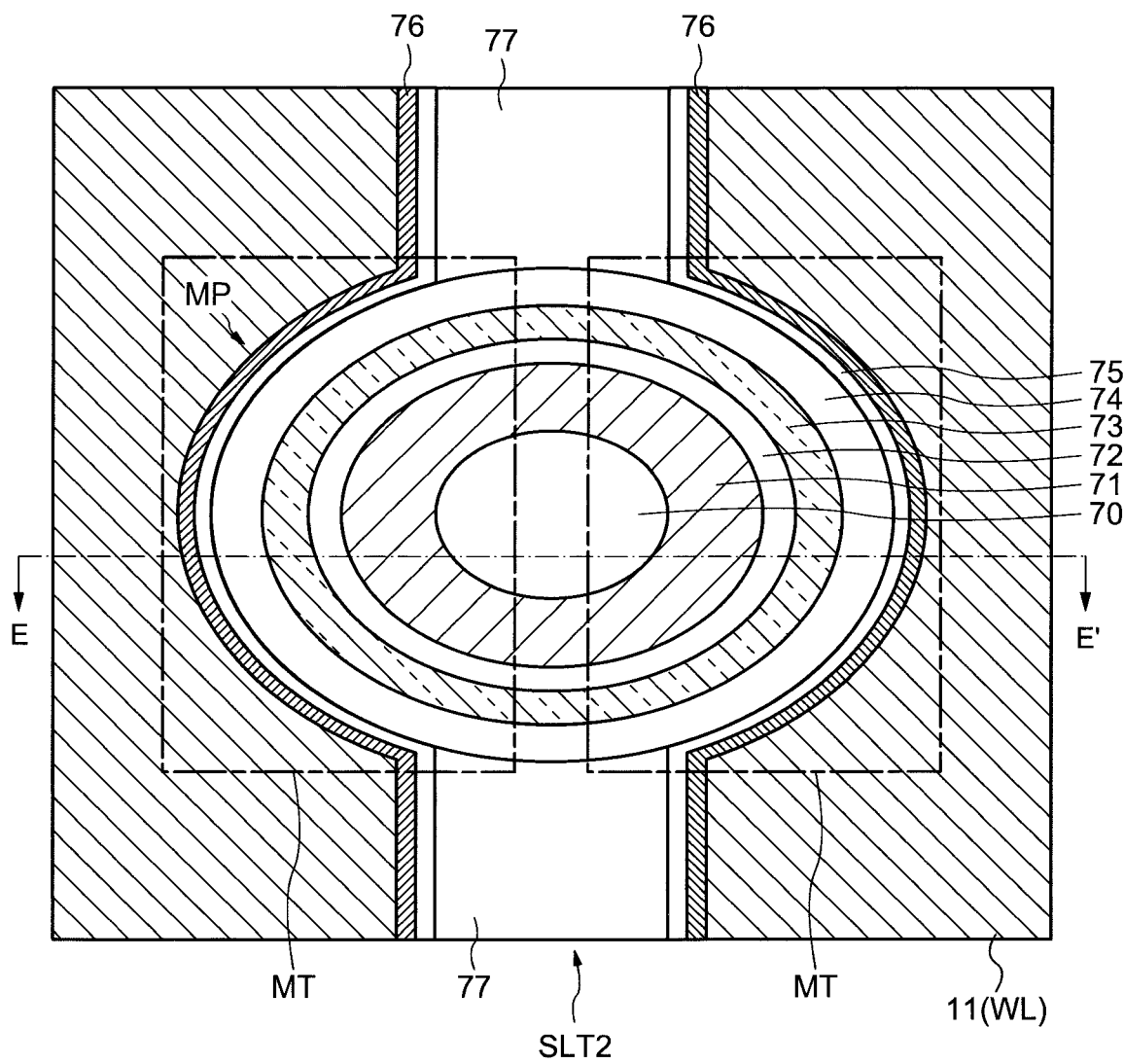
FIG. 11 is a modification of the memory cell shown in FIG. 9.
Figure 12:
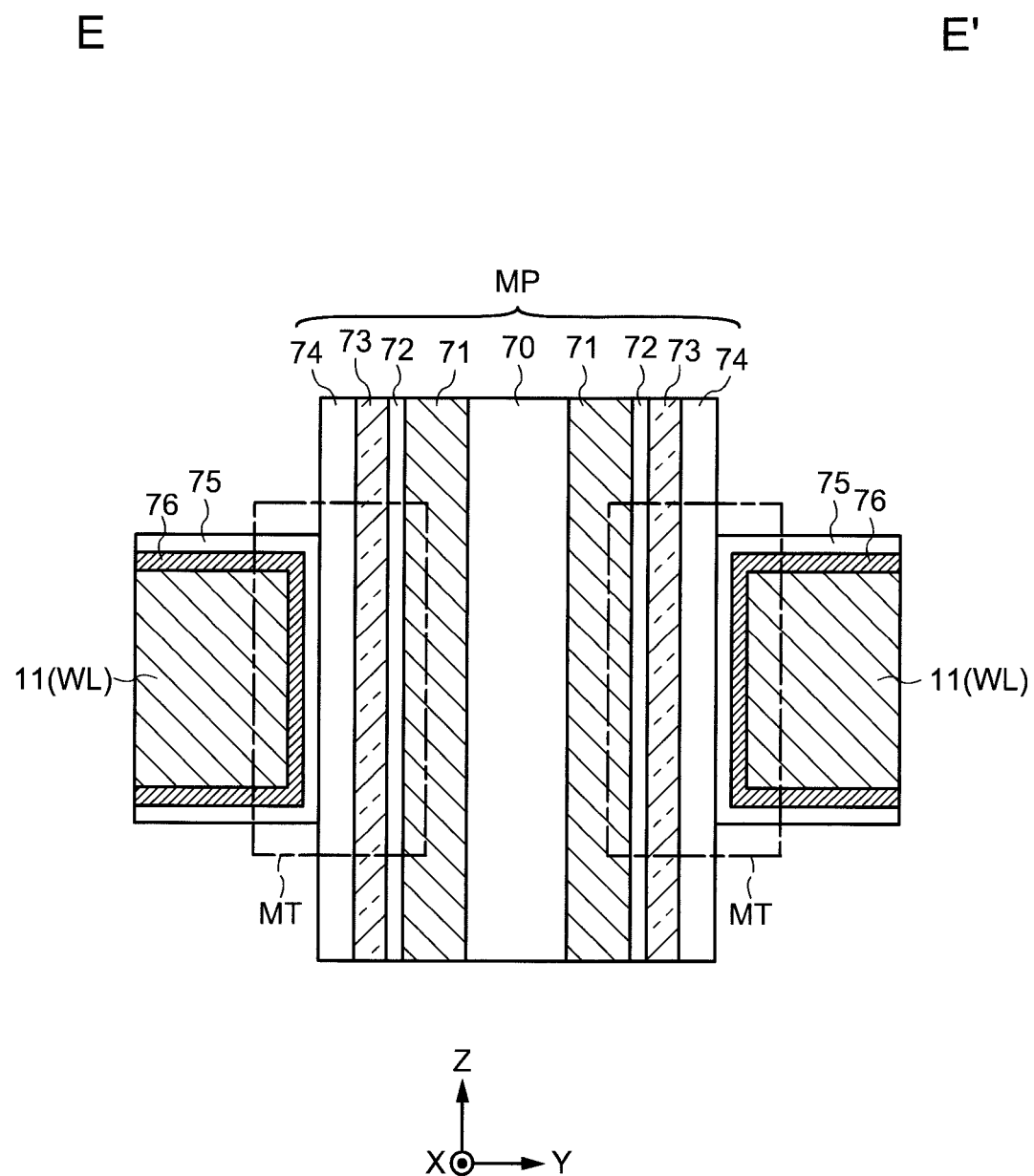
FIG. 12 is an E-E' cross-sectional view of the memory cell shown in FIG. 11.

The configurations of the memory pillar MP and the memory cell transistor MT according to a second example will be described with reference to FIGS. 11 and 12. FIG. 11 is a modification of the memory cell shown in FIG. 9. FIG. 12 is an E-E' cross-sectional view of the memory cell shown in FIG. 11. In the second example, a MONOS type memory cell transistor MT in which an insulation layer is used in the charge storage layer of the memory cell transistor MT is shown.

As shown in FIGS. 11 and 12, the memory pillar MP includes an insulation layer 70, a semiconductor layer 71, and insulation layers 72 to 74 provided along the Z-direction. The insulation layer 70 is, for example, a silicon oxide layer. The semiconductor layer 71 is provided to surround the periphery of the insulation layer 70. The semiconductor layer 71 functions as the channel of the memory cell transistor MT. The semiconductor layer 71 is, for example, a polycrystalline silicon layer. The semiconductor layer 71 is continuously provided between the two memory cell transistors MT included in one memory pillar MP. Therefore, the channels formed in each of the two memory cell transistors MT share a part of the memory pillar MP.

The insulation layer 72 is provided to surround the semiconductor layer 71, and functions as the gate insulation layer of the memory cell transistor MT. The insulation layer 72 is, for example, a stacked structure of a silicon oxide layer and a silicon nitride layer. The insulation layer 73 is provided to surround the periphery of the semiconductor layer 71 and functions as the charge storage layer of the memory cell transistor MT. The insulation layer 73 is, for example, a silicon nitride layer. The insulation layer 74 is provided to surround the periphery of the insulation layer 73 and functions as the block insulation layer of the memory cell transistor MT. The insulation layer 74 is, for example, a silicon oxide layer. An insulation layer 77 is embedded in the slit SLT2 except for the memory pillar MP portion. The insulation layer 77 is, for example, a silicon oxide layer.

For example, an AIO layer 75 is provided around the memory pillar MP having the above-described configuration. For example, a barrier metal layer 76 (TiN layer or the like) is provided around the AIO layer 75. The wiring layer 11 functioning as the word line WL is provided around the barrier metal layer 76. The wiring layer 11 is, for example, tungsten.

According to the above configuration, two memory cell transistors MT are provided in one memory pillar MP along the Y-direction. The select transistors ST1 and ST2 also have the same configuration as described above.

[1-5. Equivalent Circuit]

Figure 13:
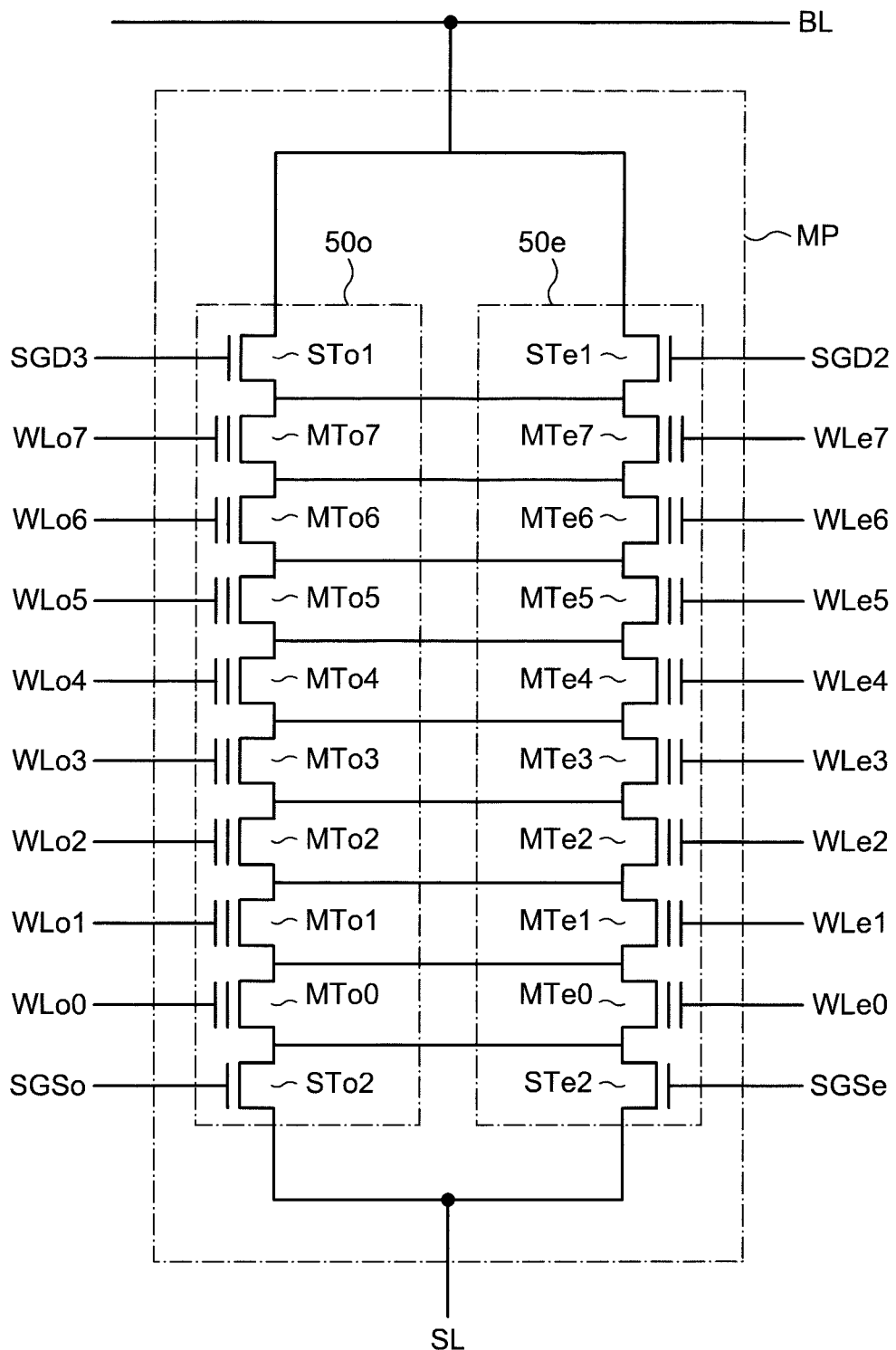
FIG. 13 is a diagram showing an equivalent circuit of adjacent strings in a semiconductor memory device according to an embodiment.

FIG. 13 is a diagram showing an equivalent circuit of adjacent strings in a semiconductor memory device according to an embodiment. As shown in FIG. 13, two NAND strings 50o and 50e are formed in one memory pillar MP. The NAND string 50o includes a selection transistor STo1, memory cell transistors MTo0 to MTo7, and a selection transistor STo2 connected in series. The NAND string 50e includes a selection transistor STe1, memory cell transistors MTe0 to MTe7, and a selection transistor STe2 connected in series.

The NAND string 50o may be referred to as a "first string". The NAND string 50e may be referred to as a "second string". In this case, the first string and the second string both adjoin one memory pillar MP (sometimes referred to as a "first pillar"). The selection transistor STo1 may be referred to as a "first transistor". In the memory cell transistors MTo0 to MTo7, the memory cell transistor MT that is a target of a read operation may be referred to as a "first memory cell". The selection transistor STe1 may be referred to as a "second transistor". In the memory cell transistors MTe0 to MTe7, the memory cell transistor MT facing the first memory cell may be referred to as a "second memory cell".

The select transistor STo1 of the NAND strings 50o is connected to the select gate line SGD3. The select transistor STe1 of the NAND strings 50e is connected to the select gate line SGD2. The memory cell transistors MTo0 to MTo7 of the NAND strings 50o are connected to the word lines WLo0 to WLo7, respectively. The memory cell transistors MTe0 to MTe7 of the NAND strings 50e are connected to the word lines WLe0 to WLe7, respectively. Among the word lines WLo0 to WLo7, the word line WLo0 is the lowermost layer, and the word line WLo7 is the uppermost layer. Among the word lines WLe0 to WLe7, the word line WLe0 is the lowermost layer, and the word line WLe7 is the uppermost layer. The select transistor STo2 of the NAND strings 50o is connected to the select gate line SGSo. The select transistor STe2 of the NAND strings 50e is connected to the select gate line SGSe.

Sources and drains of the opposing select transistors STo1 and STe1 are electrically connected to each other. Sources and drains of the opposing memory cell transistors MTo0 to MTo7 and MTe0 to MTe7 are electrically connected to each other. Sources and drains of the opposing select transistors STo2 and STe2 are electrically connected to each other. This is due to the fact that each channel formed in the two opposing transistors shares a portion of the memory pillar MP.

The two NAND strings 50o and 50e in the same memory pillar MP are connected to the same bit line BL and the same source line SL.

The bit line BL connected to both the first transistor (the selection transistor STo1) and the second transistor (the selection transistor STe1) may be referred to as a "first bit line". The select gate line SGD3 may be referred to as a "first gate line". The first gate line is connected to the first transistor. The word line WLo connected to the first memory cell (MTo) may be referred to as a "first word line."

The select gate line SGD2 may be referred to as a "second gate line". The second gate line is connected to the second transistor (STe1). As shown in FIG. 5, the first gate line (SGD3) and the second gate line (SGD2) sandwich the first pillars (MP2, MP6, MP7, MP10, MP14 and MP15). The first gate line and the second gate line are provided in the same layer. In other words, the first gate line and the second gate line are provided on the same insulating layer (sometimes referred to as a "first insulating layer"). In other words, both the first gate line and the second gate line are in contact with the first insulating layer.

The word line WLe connected to the second memory cell (MTe) may be referred to as a "second word line." As shown in FIG. 6, the first word line (WLo) and the second word line (WLe) sandwich the first pillars (MP2, MP6, MP7, MP10, MP14 and MP15). The first word line and the second word line are provided in the same layer. In other words, the first word line and the second word line are provided on the same insulating layer (sometimes referred to as a "second insulating layer"). In other words, both the first word line and the second word line are in contact with the second insulating layer.

[1-6. Read Operation]

[1-6-1. Selection of Selection Transistor]

A state in which the select gate line SGD is selected will be described with reference to FIG. 5 and FIG. 6. The following read operation is executed by a control circuit provided in the memory controller 2.

In the case where any one of the select gate lines SGD0 to SGD3 is selected, a voltage for turning on the select transistor ST1 is supplied to any one of the wiring layers 10-0 to 10-3 corresponding to the selected select gate line. For example, if the wiring layer 10-1 is selected, the eight selection transistors ST1 provided in the memory pillars MP0, MP1, MP4, MP5, MP8, MP9, MP12 and MP13 are turned on. Thus, eight memory cell transistors MT belonging to the memory pillars described above are selected. That is, the eight memory cell transistors MT described above form a single-page. Since an operation in the case where the wiring layer other than the wiring layer 10-1 is selected is the same as the operation described above, the description thereof will be omitted.

[1-6-2. Timing Chart of Read Operation]

Figure 14:
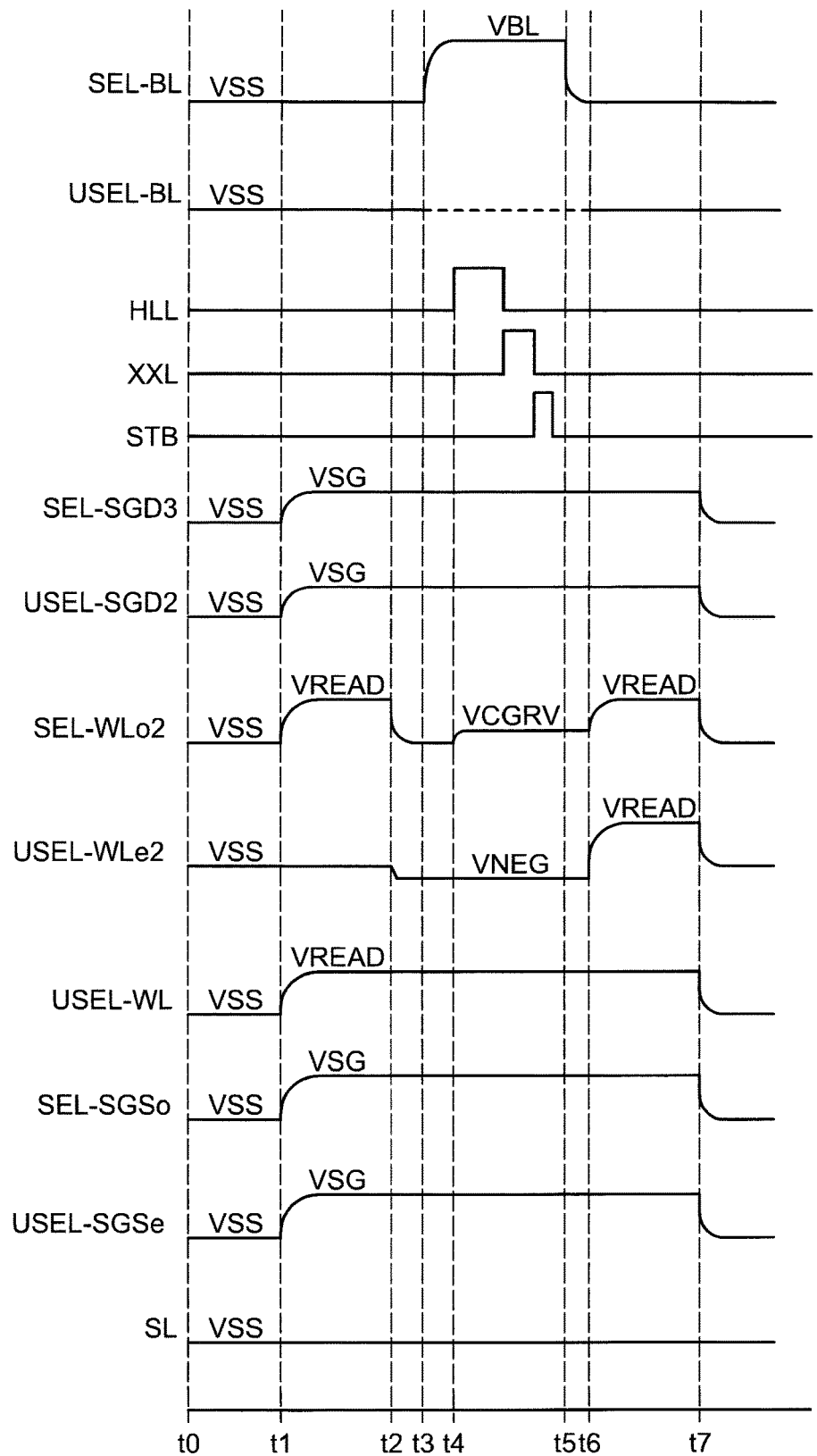
FIG. 14 is a timing chart showing a read operation in a semiconductor memory device according to an embodiment.
Figure 15:
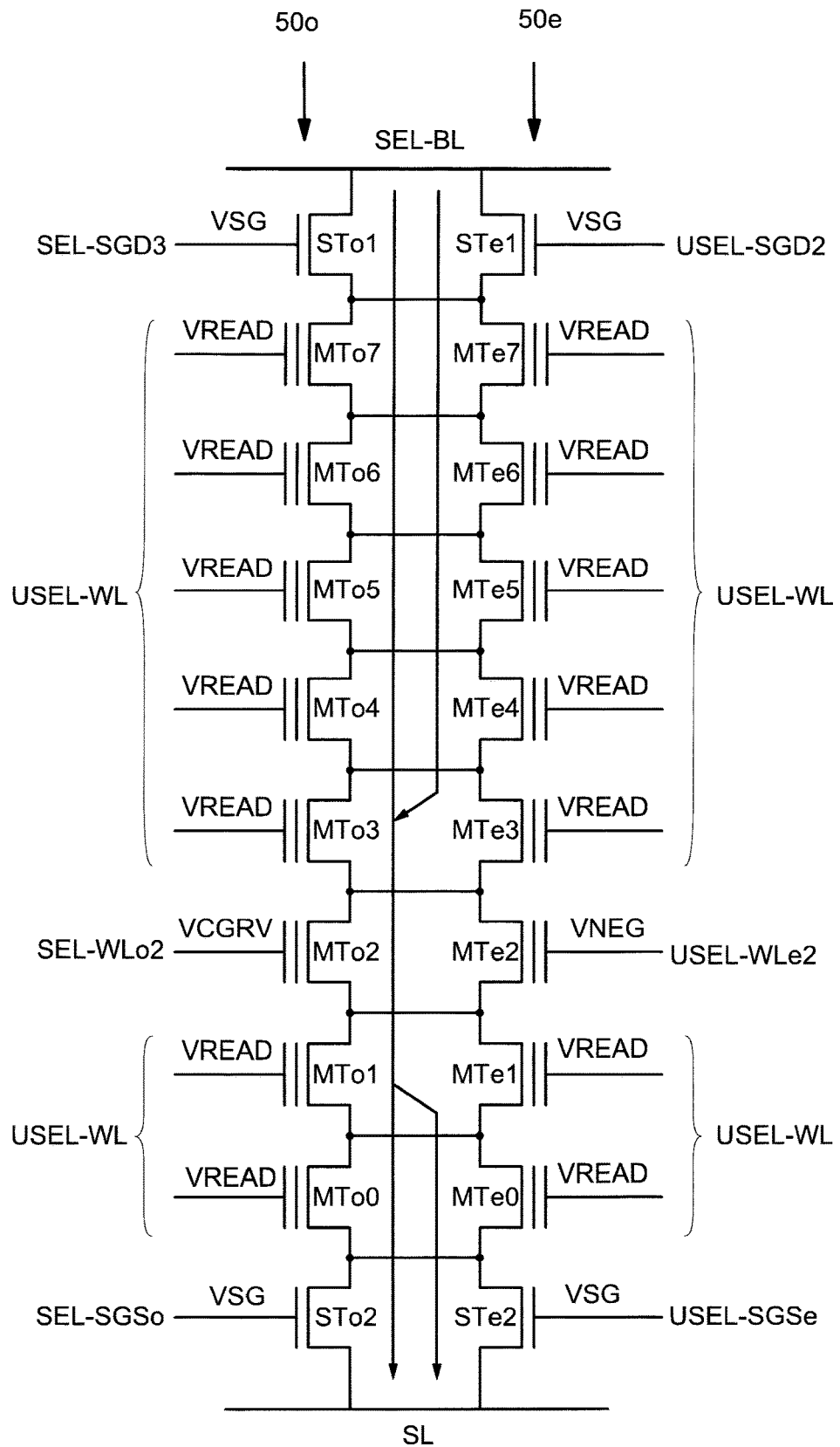
FIG. 15 is a diagram showing a read operation in a semiconductor memory device according to an embodiment.

A data read operation in a NAND flash memory having the above configuration will be described with reference to FIG. 14 and FIG. 15. FIG. 14 is a timing chart showing voltage changes of various lines in the case where a read operation is performed on the memory cell transistors MT belonging to the select gate line SGD3, the word line WLo2, and the bit lines BL of the second group GR2. FIG. 15 is a diagram showing a current flow in the case described above.

In FIG. 14, "SEL-BL" is a bit line selected in the read operation. In other words, "SEL-BL" is a bit line connected to the memory cell transistor MT which is the target of the read operation. "USEL-BL" is an unselected bit line. For example, as shown in FIG. 5, in the case where a read operation is performed on the bit lines BL of the second group GR2, "SEL-BL" is bit lines BL1 to BL3, BL5 to BL7 and "USEL-BL" is bit lines BL0 and BL4 of the first group GR1. "HLL," "XLL," and "STB" are control signals, respectively.

"SEL-" refers to a control line connected to the selected select transistor and the memory cell transistor in the read operation. "USEL-" refers to a control line connected to an unselected select transistor and a memory cell transistor.

In the following explanation, for example, in the case where the memory cell transistors MTo and MTe do not need to be distinguished, they are simply referred to as "memory cell transistors MT." Similarly, in the case where the selection transistors STo and STe do not need to be distinguished, they are simply referred to as "selection transistors ST."

In FIG. 15, the target of the read operation is the memory cell transistor MTo2. The word line connected to the memory cell transistor MTo2 is "SEL-WLo2". A word line connected to the memory cell transistor MTe2 facing the memory cell transistor MTo2 is "USEL-WLe2". Other word lines are "USEL-WL." Select gate lines connected to the select transistors STo1 and STo2 included in the NAND strings 50o to which the memory cell transistors MTo2 belong are "SEL-SGD3" and "SEL-SGSo", respectively. The select gate lines connected to the select transistors STe1 and STe2 included in the NAND strings 50e to which the memory cell transistor MTe2 belong are "USEL-SGD2" and "USEL-SGSe", respectively.

As shown in FIG. 14, at time t1, a voltage VSG is supplied to all the select gate lines SGD (including SEL-SGD3 and USEL-SGD2) in the select block BLK, and the select transistor ST1 is turned on. Similarly, at the time t1, all the select gate lines SGS (SEL-SGSo and USEL-SGSe) in the select block BLK are supplied with the voltage VSG, and the select transistor ST2 is turned on.

As shown in FIG. 14, at the time t1, the word line SEL-WLo2, USEL-WL is supplied with a voltage VREAD, and the memory cell transistors MTo0 to MTo7, MTe0 to MTe1, MTe3 to MTe7 connected to these word lines are turned on regardless of stored data. At the time t1, the word line USEL-WLe2 connected to the memory cell transistor MTe2 is continuously supplied with a voltage VSS. The above operation is an initial operation in the read operation.

Referring to FIG. 15, the memory cell transistor MTo2 connected to the word line SEL-WLo2 and the memory cell transistor MTe2 connected to the word line USEL-WLe2 share channels with each other.

As described above, since the select gate lines SEL-SGD3 and USEL-SGD2 and the select gate lines SEL-SGSo and USEL-SGSe are supplied with the voltage VSG, the select transistors ST1 and ST2 are turned on. Since the voltage VREAD is supplied to the word lines SEL-WLo2 and USEL-WL, and the voltage VSS is supplied to the word line USEL-WLe2, the memory cell transistors MT other than the memory cell transistor MTe2 are turned on regardless of the stored data. As a result, the voltage VSS (for example, 0 V) is supplied to all the channels of the memory cell transistors MT other than the memory cell transistor MTe2. An on-state of all the memory cell transistors MT other than the selection transistors ST1 and ST2 and the memory cell transistor MTe2 is continued until the following time t7.

Next, at time t2, the word line SEL-WLo2 is supplied with the voltage VSS. Similarly, at the time t2, the word line USEL-WLe2 is supplied with a voltage VNEG. In other words, the voltage supplied to the word line SEL-WLo2 drops from the voltage VREAD to the voltage VSS, and the voltage supplied to the word line USEL-WLe2 drops. The voltage VNEG is a voltage for forcibly turning off the memory cell transistor MT regardless of charges accumulated in the memory cell transistor MT. That is, the voltage VNEG is a voltage that is sufficiently lower than the threshold voltage of the memory cell transistor MT in the erased state. Even after the time t2 has elapsed, the select gate lines SEL-SGD3 and USEL-SGD2 and the select gate lines SEL-SGSo and USEL-SGSe are continuously supplied with the voltage VSG. Similarly, even after the time t2 has elapsed, the word line USEL-WL is continuously supplied with the voltage VREAD.

Next, at time t3, the bit line SEL-BL selected in the read operation is precharged. By this operation, the voltage VBL is supplied to the selected bit line SEL-BL. As shown in FIG. 14, the sense amplifier 31 is controlled by the control signal HLL, the control signal XXL, and the control signal STB. At the time t3, the unselected bit line USEL-BL is floating. A duration during which the unselected bit line USEL-BL is floating is indicated by a dotted line.

Next, at time t4, a read voltage VCGRV is supplied to the selected word line SEL-WLo2 while the voltage VSG is supplied to the select gate lines SEL-SGD3 and USEL-SGD2 and the select gate lines SEL-SGSo and USEL-SGSe. At the time t4, the voltage VNEG is supplied to the unselected word line USEL-WLe2, and the voltage VREAD is supplied to the unselected word line USEL-WL. The read voltage VCGRV is a voltage corresponding to a read level, and is a voltage for determining whether the stored data of the selected memory cell transistor MT is "0" or "1".

A state at this time is shown in FIG. 15. As a consequence of the control as described above, the selection transistors ST1 and ST2 and the memory cell transistors MTo0 to MTo1, MTo3 to MTo7, MTe0 to MTe1 and MTe3 to MTe7 are turned on.

Next, when the read operation is finished, the voltage supplied to the selected bit line SEL-BL changes from the voltage VBL to the voltage VSS at time t5. Next, at time t6, the selected word line SEL-WLo2 and the unselected word line USEL-WLe2 are supplied with the voltage VREAD.

In the case where the read operation is performed on the memory cell transistors MT belonging to the select gate line SGD3, the word line WLo2, and the bit line BL of the first group GR1, the voltage VSG is supplied to USEL-SGD0 instead of USEL-SGD2 from time t1 to t7. In this case, "SEL-BL" is the bit lines BL0 and BL4 and "USEL-BL" is the bit lines BL1 to BL3 and BL5 to BL7.

In the following explanation, the memory pillar MP2 may be referred to as a "first pillar." The word line WLo2 may be referred to as a "first word line". The word line WLe2 may be referred to as a "second word line". The memory cell transistor MTo2 may be referred to as a "first memory cell".

The memory cell transistor MTe2 may be referred to as a "second memory cell". The bit line BL1 may be referred to as a "first bit line".

In the case described above, the read operation (the state shown in FIG. 15) after the time t4 can be expressed as follows. When the read operation on the first memory cell (MTo2 of MP2) is performed, the control circuit of the memory controller 2 applies the read voltage (voltage VCGRV) to the first word line (WLo2), applies the voltage (voltage VNEG) to forcibly turn off the second memory cell (MTe2 of MP2) to the second word line (WLe2), applies the voltage (VSG) to turn on the first transistor (STo1 of MP2) to the first gate line (SGD3), and applies the voltage (VSG) to turn on the second transistor (STe1 of MP2) to the second gate line (SGD2).

In the following explanation, the memory pillar MP3 may be referred to as a "second pillar." The memory pillar MP3 is provided with NAND strings 50o and 50e similar to that of FIG. 13. The NAND strings 50o adjoining the second pillar may be referred to as "third strings". The NAND strings 50e adjoining the second pillar may be referred to as "fourth strings". The selection transistor STo1 included in the third string may be referred to as a "third transistor". The memory cell transistor MTo2 included in the third string may be referred to as a "third memory cell". The selection transistor STe1 included in the fourth string may be referred to as a "fourth transistor". The memory cell transistor MTe2 included in the fourth string may be referred to as a "fourth memory cell". The bit line BL0 may be referred to as a "second bit line".

As described above, the memory pillar MP1 may be referred to as a "third pillar". The memory pillar MP1 is provided with NAND strings 50o and 50e similar to that of FIG. 13. The NAND strings 50e adjoining the third pillar may be referred to as "fifth strings". The selection transistor STe1 included in the fifth string may be referred to as a "fifth transistor". The memory cell transistor MTe2 included in the fifth string may be referred to as a "fifth memory cell". The fifth transistor (STe1 of MP1) is connected to the second bit line (BL0) and the second gate line (SGD2). The fifth memory cell (MTe2 of MP1) is connected to the second word line (WLe2).

The second bit line (BL0) is connected to the third transistor (STo1 of MP3) and the fourth transistor (STe1 of MP3). The select gate line SGD0 may be referred to as a "third gate line". As shown in FIG. 5, the first gate line (SGD3) and the third gate line (SGD0) sandwich the second pillar (MP3). The third gate line (SGD0) is provided on the same insulating layer (sometimes referred to as a "first insulating layer") as the first gate line (SGD3) and the second gate line (SGD2). In other words, both the first gate line and the second gate line are in contact with the first insulating layer. The third transistor (STo1 of MP3) is connected to the first gate line (SGD3). The third memory cell (MTo2 of MP3) is connected to the first word line (WLo2). The fourth memory cell (MTe2 of MP3) is connected to the second word line (WLe2). As shown in FIG. 6, the second pillar (MP3) is sandwiched between the first word line (WLo2) and the second word line (WLe2).

In the case described above, the read operation after the time t4 (the status shown in FIG. 15) can be expressed as follows. The control circuit of the memory controller 2 supplies a voltage to the first bit line (BL1) and floats the second bit line (BL0) when the read operation on the first memory cell (MTo2 of MP2) is performed.

In the case where the read operation is performed on the memory cell transistor MTo2 by the above operation, the memory cell transistor MTe2 sharing a channel with the memory cell transistor MTo2 is forcibly turned off. Therefore, in the read operation with respect to the memory cell transistor MTo2, an effect of the memory cell transistor MTe2 that is not the target of the read operation can be eliminated. Further, since all the memory cell transistors MT other than the memory cell transistors MTo2 and MTe2 are in the on-state and the select transistors ST1 and ST2 are also in the on-state, the resistive components of these transistors can be reduced. As a consequence, the memory cell transistor MTo2, which is the target of the read operation, can be read more accurately.

[1-7. Circuit Configuration of Sense Amplifier Unit]

Figure 16:
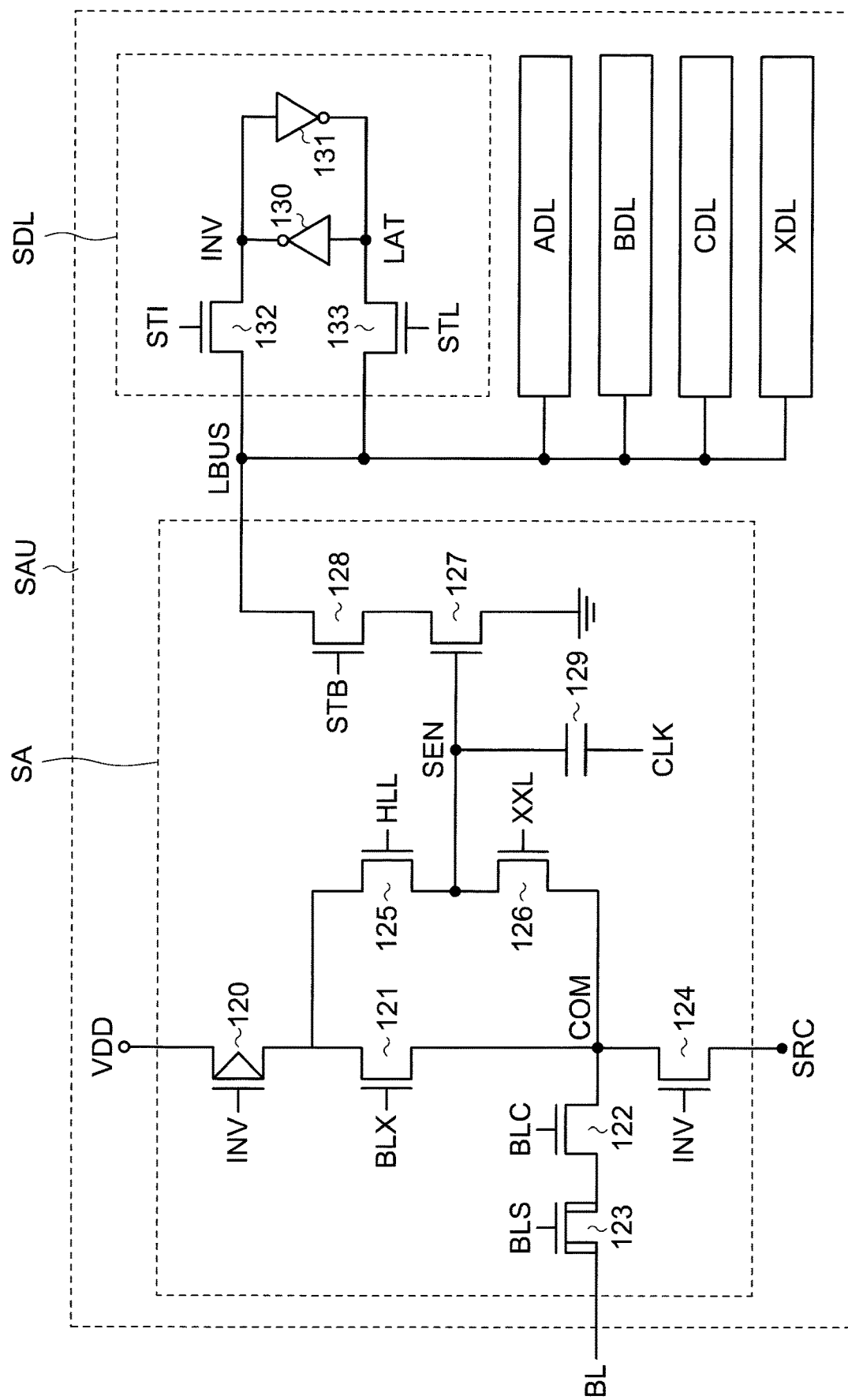
FIG. 16 is an example of a circuit configuration of a sense amplifier of a semiconductor memory device according to an embodiment.

An example of a circuit configuration of a sense amplifier unit SAU will be described. FIG. 16 is an example of the circuit configuration of the sense amplifier unit SAU. However, the circuit configuration of the sense amplifier unit SAU according to the present embodiment is not limited to the example shown in FIG. 16.

The sense amplifier 31 shown in FIG. 3 includes a plurality of sense amplifier units SAU each associated with bit lines BL0 to BLm (m is a natural number equal to or greater than 1). FIG. 16 shows a typical circuit configuration of one sense amplifier unit SAU.

The sense amplifier unit SAU temporarily stores, for example, data read out to the corresponding bit line BL. The sense amplifier unit SAU can perform a logical operation using the temporarily stored data. As will be described later, the semiconductor memory device 5 can execute the read operation according to the present embodiment by using the sense amplifier 31 (sense amplifier unit SAU).

As shown in FIG. 16, the sense amplifier unit SAU includes a sense amplifier section SA and latch circuits SDL, ADL, BDL, CDL and XDL. The sense amplifier unit and the latch circuits are connected to each other by a bus LBUS so as to be able to transmit and receive data.

For example, in the read operation, the sense amplifier section SA senses data read to the corresponding bit line BL, and determines whether the read data is "0" or "1". The sense amplifier section SA includes, for example, a p-channel MOS transistor 120, n-channel MOS transistors 121 to 128, and a capacitor 129.

A first terminal of the transistor 120 is connected to a power supply line (VDD), and a gate of the transistor 120 is connected to a node INV in the latch circuit SDL. A first terminal of the transistor 121 is connected to a second terminal of the transistor 120, and a second terminal of the transistor 121 is connected to a node COM. A control signal BLX is input to a gate of the transistor 121. A first terminal of the transistor 122 is connected to the node COM. A control signal BLC is input to a gate of the transistor 122. The transistor 123 is a high breakdown voltage MOS transistor. A first terminal of the transistor 123 is connected to a second terminal of the transistor 122, and a second terminal of the transistor 123 is connected to a corresponding bit line BL. A control signal BLS is input to a gate of the transistor 123.

A first terminal of the transistor 124 is connected to the node COM. A second terminal of the transistor 124 is connected to a node SRC. A gate of the transistor 124 is connected to the node INV. A first terminal of the transistor 125 is connected to the second terminal of the transistor 120. A second terminal of the transistor 125 is connected to a node SEN. The control signal HLL is input to a gate of the transistor 125. A first terminal of the transistor 126 is connected to the node SEN. A second terminal of the transistor 126 is connected to the node COM. The control signal XXL is input to a gate of the transistor 126.

A first terminal of the transistor 127 is grounded and a gate of the transistor 127 is connected to the node SEN. A first terminal of the transistor 128 is connected to a second terminal of the transistor 127, and a second terminal of the transistor 128 is connected to the bus LBUS. The control signal STB is input to a gate of the transistor 128. A first terminal of the capacitor 129 is connected to the node SEN. A clock CLK is input to a second terminal of the capacitor 129.

The control signals BLX, BLC, BLS, HLL, XXL and STB are generated by the sequencer 27 shown in FIG. 3, for example. The voltage VDD, which is an internal power supply voltage of the semiconductor memory device 5, for example, is applied to the power supply line connected to the first terminal of the transistor 120, and the voltage VSS, which is a ground voltage of the semiconductor memory device 5, for example, is applied to the node SRC.

The latch circuits SDL, ADL, BDL, CDL and XDL temporarily store the read data. The latch circuit XDL is connected to, for example, the register 26, and is used to input and output data between the sense amplifier unit SAU and the input/output circuit 22.

The latch circuit SDL includes, for example, inverters 130 and 131, and n-channel MOS transistors 132 and 133. An input node of the inverter 130 is connected to the node LAT. An output node of the inverter 130 is connected to the node INV. An input node of the inverter 131 is connected to the node INV, and an output node of the inverter 131 is connected to the node LAT. A first terminal of the transistor 132 is connected to the node INV, and a second terminal of the transistor 132 is connected to the bus LBUS. A control signal STI is input to a gate of the transistor 132. A first terminal of the transistor 133 is connected to the node LAT, and a second terminal of the transistor 133 is connected to the bus LBUS. A control signal STL is input to a gate of the transistor 133. For example, data stored in the node LAT corresponds to data stored in the latch circuit SDL, and data stored in the node INV corresponds to inverted data of data stored in the node LAT. The circuit configuration of the latch circuits ADL, BDL, CDL and XDL is the same as a circuit configuration of the latch circuit SDL, for example, and therefore will not be described.

In the sense amplifier 31 described above, a timing at which each of the sense amplifier units SAU determines the data read to the bit line BL is based on a timing at which the control signal STB is asserted. In this specification and the like, "the sequencer 27 asserts the control signal STB" corresponds to the sequencer 27 changing the control signal STB from the "L" level to the "H" level.

The configuration of the sense amplifier 31 according to the present embodiment is not limited to the configuration described above. For example, in the sense amplifier unit SAU, the transistor 128 to which the control STB is input may be a p-channel MOS transistor. Here, "the sequencer 27 asserts the control signal STB" corresponds to the sequencer 27 changing the control signal STB from the "H" level to the "L" level.

The number of latch circuits included in the sense amplifier unit SAU is arbitrary. The number of the latch circuits is designed based on, for example, the number of bits of data stored by one memory cell transistor MC. A plurality of bit lines BL may be connected to one sense amplifier unit SAU via selectors.

As described above, according to the memory system of the present embodiment, for example, when the read operation is performed on the memory cell transistor MTo which is the target of the read operation, not only the select transistor STo1 included in the NAND strings 50o to which the memory cell transistor MTo belongs but also the select transistor STe1 included in the NAND strings 50e to which the memory cell transistor MTe opposed to the memory cell transistor MTo belongs are turned on. This operation makes it possible to increase a current value obtained during the read operation. As a consequence, the memory cell transistor MTo, which is the target of the read operation, can be read more accurately.

In the present embodiment, although the voltage VNEG is supplied only to the memory cell transistor MTe2 facing the memory cell transistor MTo2 which is the target of the read operation, the configuration is not limited to this configuration. For example, the voltage VNEG may be supplied to memory cell transistors (MTe3 and MTe1) provided in at least one of an upper layer and a lower layer of the memory cell transistor MTe2.

2. Second Embodiment

A memory system according to a second embodiment will be described with reference to FIG. 17 to FIG. 22. The memory system according to the second embodiment is similar to the memory system according to the first embodiment. In the following description, descriptions of the same configuration as that of the memory system according to the first embodiment will be omitted, and differences from the memory system according to the first embodiment will be mainly described.

[2-1. Read Operation]

Figure 17:
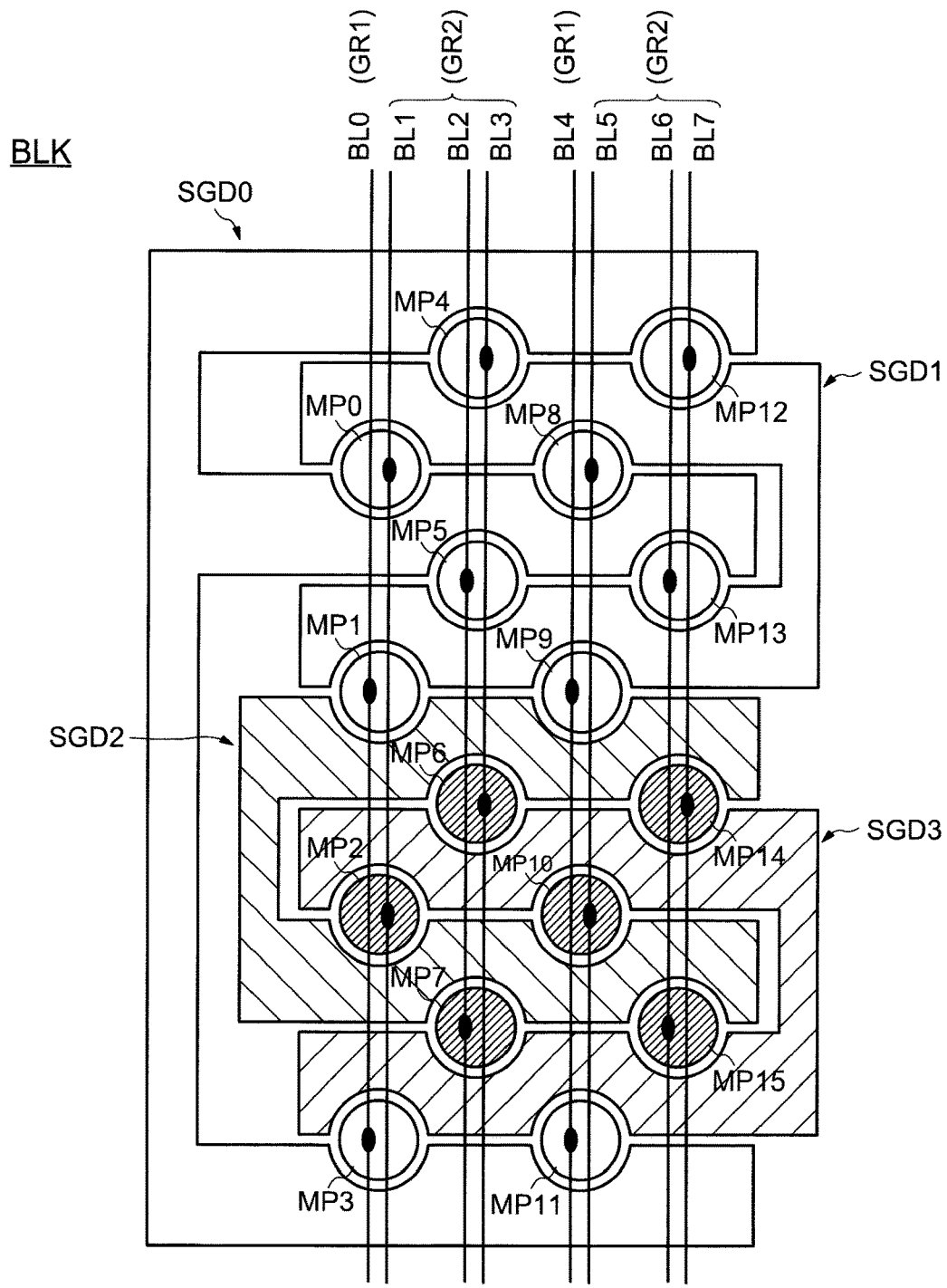
FIG. 17 is a diagram for describing a read operation with reference to a layout of select gate lines and memory pillars of a semiconductor memory device according to an embodiment.
Figure 18:
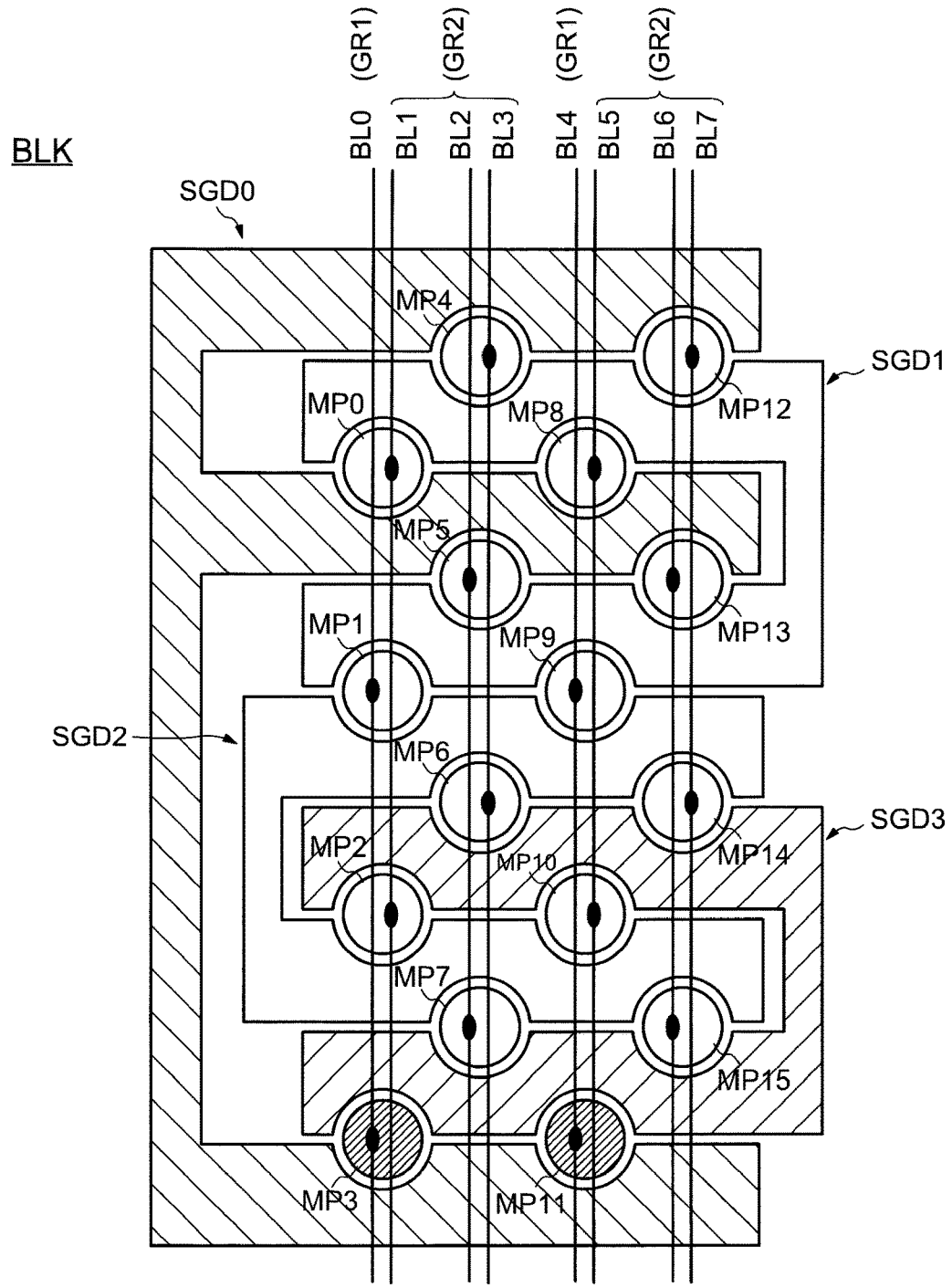
FIG. 18 is a diagram for describing a read operation with reference to a layout of select gate lines and memory pillars of a semiconductor memory device according to an embodiment.

FIG. 17 and FIG. 18 are diagrams for describing a read operation with reference to a layout of select gate lines and memory pillars of the semiconductor memory device according to an embodiment. Hereinafter, a read operation for the memory cell transistors MT belonging to the select gate lines SGD3 and the bit lines BL of the second group GR2 will be described. In FIG. 17, the select gate lines SGD2 and SGD3 and the memory pillars MP sandwiched therebetween are highlighted. As shown in FIG. 17, the memory pillars MP2, MP6, MP7, MP10, MP14 and MP15 are sandwiched by the select gate lines SGD2 and SGD3. In the present embodiment, the read operation shown in FIG. 14 and FIG. 15 is performed on the memory cell transistors MT belonging to these memory pillars MP. Here, the voltage VSG is supplied to both of the select gate lines SGD2 and SGD3.

As shown in FIG. 17, the memory pillar MP2 is connected to the bit line BL1, the memory pillar MP7 is connected to the bit line BL2, the memory pillar MP6 is connected to the bit line BL3, the memory pillar MP10 is connected to the bit line BL5, the memory pillar MP15 is connected to the bit line BL6, and the memory pillar MP14 is connected to the bit line BL7. In other words, the memory pillars MP are connected to different bit lines. Therefore, the memory cell transistors MT belonging to these memory pillars MP can perform the read operation while the voltage VSG is supplied to the select gate lines SGD2 and SGD3.

On the other hand, when the voltage VSG is supplied to the select gate lines SGD2 and SGD3, the select transistors ST1 respectively belonging to the memory pillars MP1 and MP9 adjacent only to the select gate line SGD2 and the select transistors ST1 respectively belonging to the memory pillars MP3 and MP11 adjacent only to the select gate line SGD3 are also turned on. For example, when the read operation is executed by selecting the bit line BL0 while the voltage VSG is supplied to the select gate lines SGD2 and SGD3, a current flows through the memory cell transistors MT respectively belonging to the memory pillars MP1 and MP3, so that the correct measurement cannot be performed. Therefore, the memory cell transistors MT belonging to the memory pillars MP1 and MP3 cannot be read while the select gate lines SGD2 and SGD3 are supplied with the voltage VSG.

Next, a read operation for the memory cell transistors MT belonging to the select gate line SGD3 and the bit lines BL of the first group GR1 will be described. In the case where the read operation is performed on the memory cell transistors MT belonging to the memory pillars MP3 and MP11, as shown in FIG. 18, the read operation needs to be performed while the select gate lines SGD0 and SGD3 sandwiching the memory pillars MP3 and MP11 are supplied with the voltage VSG.

As described above, the read operation for the memory cell transistors MT belonging to the memory pillars MP2, MP6, MP7, MP10, MP14 and MP15 connected to the bit lines BL1 to BL3 and BL5 to BL7 of the second group GR2 can be executed with the voltage VSG applied to the select gate lines SGD2 and SGD3. The read operation for the memory cell transistors MT belonging to the memory pillars MP3 and MP11 connected to the bit lines BL0 and BL4 of the first group GR1 can be performed while applying the voltage VSG to the select gate lines SGD0 and SGD3.

By the read operation described above, the read operation can be performed in a state (that is, an on-state) in which the voltage VSG is supplied to both the select transistor STo1 connected in series with the memory cell transistor MTo which is the target of the read operation and the select transistor STe1 connected in series with the memory cell transistor MTe which shares the channel with the memory cell transistor MTo, for example.

In the following explanation, the memory pillars MP and the NAND strings 50o and 50e provided in the memory pillars MP may be collectively referred to as a "memory structure body". As described above, the memory structure body provided between the first gate (SGD3) and the second gate (SGD2) is referred to as a "first memory structure body". The first memory structure body includes the first string (50o of MP2) and the second string (50e of MP2). A memory structure body provided between the first gate (SGD3) and the third gate (SGD0) is referred to as a "second memory structure body". The second memory structure body includes the third string (50o of MP3) and the fourth string (50e of MP3).

[2-2. Connection Relationship between Bit Line and Sense Amplifier]

Figure 19:
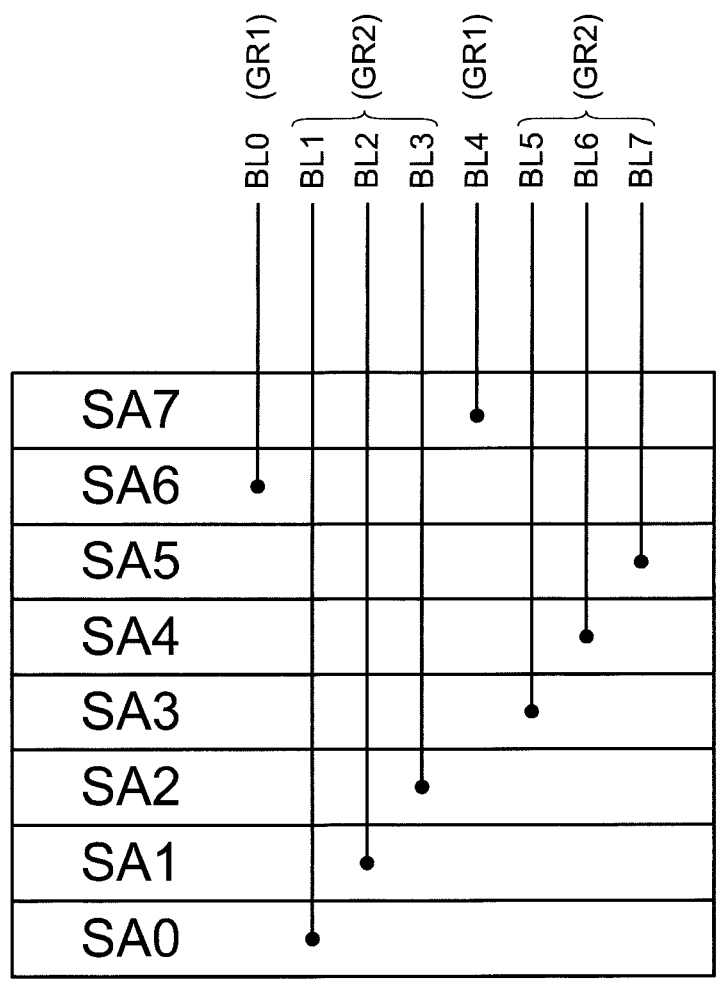
FIG. 19 is a diagram showing connection relationships between bit lines and sense amplifiers in a semiconductor memory device according to an embodiment.
Figure 20:
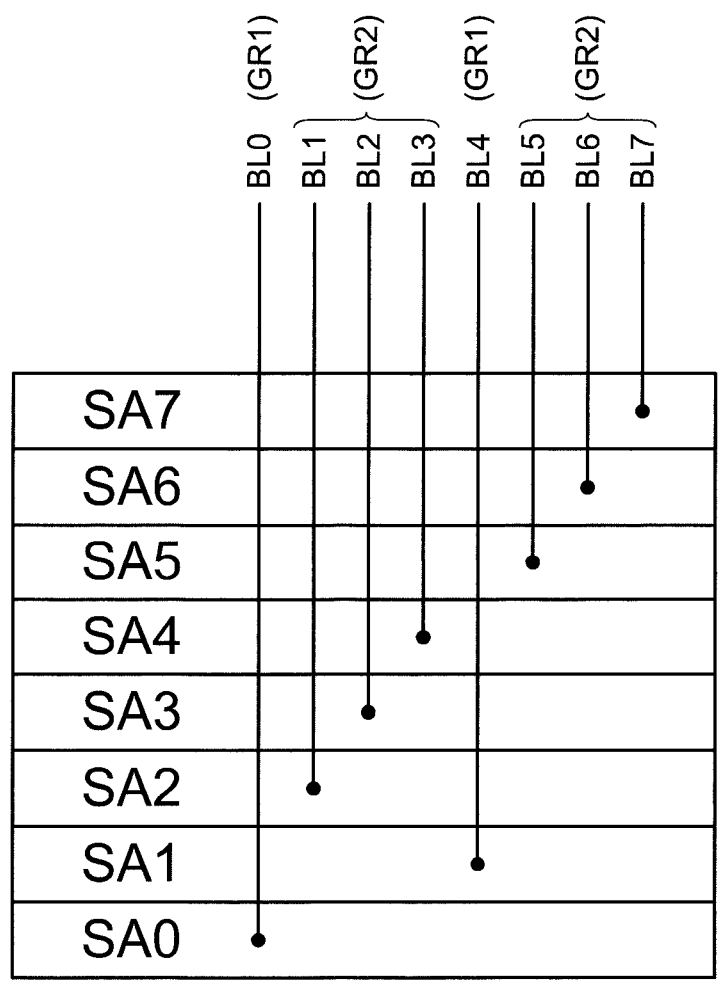
FIG. 20 is a diagram showing connection relationships between bit lines and sense amplifiers in a semiconductor memory device according to an embodiment.

Referring to FIG. 19 and FIG. 20, a connecting relationship between the bit lines BL0 to BL7 and sense amplifiers SA0 to SA7 will be described. The bit lines BL0 to BL7 in FIG. 19 and FIG. 20 correspond to the bit lines BL0 to BL7 in FIG. 17 and FIG. 18, respectively. For the sense amplifiers SA0 to SA7, the signals STB may be asserted at the same timing. The STB of the sense amplifiers SA0 to SA5 may be asserted at the same timing, and the STB of the sense amplifiers SA6 and SA7 may be asserted at the same timing. In the sense amplifiers SA0 to SA7, a sense amplifier to which a relatively smaller address is assigned may be referred to as a "first sense amplifier". In the sense amplifiers SA0 to SA7, a sense amplifier to which a relatively large address is assigned may be referred to as a "second sense amplifier".

FIG. 19 is an example of the connection relationship between the bit line and the sense amplifier. As shown in FIG. 19, the bit line BL1 is connected to the sense amplifier SA0, the bit line BL2 is connected to the sense amplifier SA1, the bit line BL3 is connected to the sense amplifier SA2, the bit line BL5 is connected to the sense amplifier SA3, the bit line BL6 is connected to the sense amplifier SA4, and the bit line BL7 is connected to the sense amplifier SA5. The bit line BL0 is connected to the sense amplifier SA6, and the bit line BL4 is connected to the sense amplifier SA7. That is, the bit lines BL1 to BL3 and BL5 to BL7 of the second group GR2 are connected to the sense amplifiers SA0 to SA5. The bit lines BL0 and BL4 of the first group GR1 are connected to the sense amplifiers SA6 to SA7.

In the exemplary embodiments shown in FIG. 17 and FIG. 19, the data read operation in the case where the select gate lines SGD2 and SGD3, the word line WLo2, and the bit line BL of the second group GR2 are selected will be described. The sense amplifiers SA0 to SA5 output data reflecting currents flowing in the memory cell transistors MTo2 belonging to the memory pillars MP2, MP6, MP7, MP10, MP14 and MP15 (see FIG. 17). On the other hand, the sense amplifier SA6 outputs data reflecting a sum of currents flowing in the two memory cell transistors MTo2 belonging to the memory pillars MP1 and MP3. The sense amplifier SA7 outputs data reflecting a sum of currents flowing in the two memory cell transistors MTo2 belonging to the memory pillars MP9 and MP11.

Outputs of the sense amplifiers SA0 to SA5 are valid because each of them reflects a current flowing through one memory cell transistor MT. On the other hand, outputs of the sense amplifiers SA6 and SA7 are invalid because each of them reflects a sum of currents flowing through two memory cell transistors MT.

The memory controller 2 reads the valid data of sense amplifiers SA0 to SA5 from a memory chip. Since the bit line BL and the sense amplifier SA are connected as shown in FIG. 19, the memory controller 2 recognizes the data stored in the region divided into the bit lines BL1 to BL3 and the bit lines BL5 to BL7 as the data output from the sense amplifiers SA0 to SA5. That is, the memory controller 2 can treat the data stored in the divided bit line BL region as consecutive data.

Next, a data read operation in the case where the select gate lines SGD0 and SGD3, the word line WLo2, and the bit line BL of the first group GR1 are selected will be described with reference to FIG. 18 and FIG. 19. The sense amplifier SA6 outputs data reflecting a current flowing in the memory cell transistor MTo2 of the memory pillar MP3 (see FIG. 18). The sense amplifier SA7 outputs data reflecting a current flowing in the memory cell transistor MTo2 of the memory pillar MP11 (see FIG. 18). On the other hand, the sense amplifiers SA0 to SA5 outputs data reflecting a sum of currents flowing through two memory cell transistors MTo2 (for example, in the case of the sense amplifier SA0, the memory cell transistors MTo2 belonging to the memory pillars MP0 and MP2).

Outputs of the sense amplifiers SA6 and SA7 are valid because each of them reflects a current flowing through one memory cell transistor MT. On the other hand, outputs of the sense amplifiers SA0 to SA5 are invalid because each of them reflects a sum of currents flowing through two memory cell transistors MT.

The memory controller 2 ignores invalid data. By connecting the bit line BL and the sense amplifier SA as shown in FIG. 19, the memory controller 2 recognizes the data stored in a region divided into the bit line BL0 and the bit line BL4 as the data output from the sense amplifiers SA6 and SA7. That is, the memory controller 2 can treat the data stored in the divided bit line BL region as consecutive data.

In the above explanation, although the memory structure body provided between the select gate lines SGD3 and SGD2 is referred to as a "first memory structure body", the first memory structure body includes a memory structure body connected to all the bit lines BL of the second group GR2.

In other words, a plurality of first bit lines (BL1 to BL3 and BL5 to BL7) connected to a plurality of first memory structure bodies (MP0, MP2, MP4 to MP8, MP10 and MP12 to MP15) are connected to a plurality of first sense amplifiers (SAO to SA5). A plurality of second bit lines (BL0 and BL4) connected to a plurality of second memory structure bodies (MP1, MP3, MP9 and MP11) are connected to a plurality of second sense amplifiers (SA6 to SA7).

FIG. 20 is an example of a connection relationship between a bit line and a sense amplifier. As shown in FIG. 20, the bit line BL0 is connected to the sense amplifier SAO, and the bit line BL4 is connected to the sense amplifier SA1. The bit line BL1 is connected to the sense amplifier SA2, the bit line BL2 is connected to the sense amplifier SA3, the bit line BL3 is connected to the sense amplifier SA4, the bit line BL5 is connected to the sense amplifier SA5, the bit line BL6 is connected to the sense amplifier SA6, and the bit line BL7 is connected to the sense amplifier SA7. That is, the bit lines BL0 and BL4 of the first group GR1 are connected to the sense amplifiers SA0 to SA1. The bit lines BL1 to BL3 and BL5 to BL7 of the second group GR2 are connected to the sense amplifiers SA2 to SA7.

In the example of embodiments shown in FIG. 17 and FIG. 20, the data read operation in the case where the select gate lines SGD2 and SGD3, the word line WLo2, and the bit line BL of the second group GR2 are selected will be described. The sense amplifiers SA2 to SA7 output data reflecting currents flowing in the memory cell transistors MTo2 belonging to the memory pillars MP2, MP6, MP7, MP10, MP14 and MP15 (see FIG. 17). On the other hand, the sense amplifier SAO outputs data reflecting a sum of currents flowing in the two memory cell transistors MTo2 belonging to the memory pillars MP1 and MP3. The sense amplifier SA1 outputs data reflecting a sum of currents flowing in the two memory cell transistors MTo2 belonging to the memory pillars MP9 and MP11.

Outputs of the sense amplifiers SA2 to SA7 are valid because each of them reflects a current flowing through one memory cell transistor MT. On the other hand, outputs of the sense amplifiers SA0 and SA1 are invalid because each of them reflects a sum of currents flowing through two memory cell transistors MT.

The memory controller 2 ignores invalid data. By connecting the bit line BL and the sense amplifier SA as shown in FIG. 20, the memory controller 2 recognizes the data stored in a region divided into the bit lines BL1 to BL3 and the bit lines BL5 to BL7 as the data output from the sense amplifiers SA2 to SA7. That is, the memory controller 2 can treat the data stored in the divided bit line BL region as consecutive data.

Next, the data read operation in the case where the select gate lines SGD0 and SGD3, the word line WLo2, and the bit line BL of the first group GR1 are selected will be described with reference to FIG. 18 and FIG. 20. The sense amplifier SAO outputs data reflecting the current flowing in the memory cell transistor MTo2 of the memory pillar MP3 (see FIG. 18). The sense amplifier SA1 outputs data reflecting the current flowing in the memory cell transistor MTo2 of the memory pillar MP11 (see FIG. 18). On the other hand, the sense amplifiers SA2 to SA7 output data reflecting a sum of currents flowing through two memory cell transistors MTo2 (for example, in the case of a sense amplifier SA2, two memory cell transistors MTo2 belonging to the memory pillars MP0 and MP2).

Outputs of the sense amplifiers SA0 and SA1 are valid because each of them reflects a current flowing through one memory cell transistor MT. On the other hand, outputs of the sense amplifiers SA2 to SA7 is invalid because each of them reflects a sum of currents flowing through two memory cell transistors MT.

The memory controller 2 ignores invalid data. By connecting the bit line BL and the sense amplifier SA as shown in FIG. 20, the memory controller 2 recognizes the data stored in a region divided into the bit line BL0 and the bit line BL4 as the data output from the sense amplifiers SA0 and SA1. That is, the memory controller 2 can treat the data stored in the divided bit line BL region as consecutive data.

In other words, the plurality of first bit lines (BL1 to BL3 and BL5 to BL7) connected to the plurality of first memory structure bodies (MP0, MP2, MP4 to MP8, MP10 and MP12 to MP15) are connected to the plurality of second sense amplifiers (SA2 to SA7). The plurality of second bit lines (BL0 and BL4) connected to the plurality of second memory structure bodies (MP1, MP3, MP9 and MP11) are connected to the plurality of first sense amplifiers (SA0 to SA1).

Although the present embodiment exemplifies a configuration in which the number of bit lines is 8, the present invention is not limited to this configuration. The number of bit lines may be more or less than 8. For example, 16 bit lines may be connected to 16 sense amplifiers SA0 to SA15. Here, a plurality of first bit lines (BL1 to BL3, BL5 to BL7, BL9 to BL11 and BL13 to BL15) connected to the plurality of first memory structure bodies may be connected to a plurality of first sense amplifiers (SA0 to SA11), and a plurality of second bit lines (BL0, BL4, BL8 and BL12) connected to the plurality of second memory structure bodies may be connected to the plurality of second sense amplifiers (SA12 to SA15). Alternatively, the plurality of first bit lines (BL1 to BL3, BL5 to BL7, BL9 to BL11 and BL13 to BL15) connected to the plurality of first memory structure bodies may be connected to a plurality of second sense amplifiers (SA4 to SA15), and the plurality of second bit lines (BL0, BL4, BL8 and BL12) connected to the plurality of second memory structure bodies may be connected to a plurality of first sense amplifiers (SA0 to SA3).

3. Third Embodiment

A memory system according to a third embodiment will be described with reference to FIG. 21 to FIG. 25. A memory system according to the third embodiment is similar to the memory system according to the first embodiment. In the following description, the same configuration as that of the memory system according to the first embodiment will be omitted, and differences from the memory system according to the first embodiment will be mainly described. In the second embodiment, the memory controller 2 treats the data stored in the divided bit line BL region as consecutive data according to the connection relationship between the bit line and the sense amplifier. On the other hand, in the present embodiment, the memory controller 2 treats the data as continuous data according to an address allocation in a memory chip. That is, in the present embodiment, the bit lines BL0 to BL7 are connected to the sense amplifiers SA0 to SA7 in this order.

[3-1. Address Conversion Table]

FIG. 21 is a diagram showing an example of an address conversion table in a semiconductor memory device according to an embodiment. In FIG. 21, addresses (add.) 11 to 13 are assigned bits (Assignment) that identify the latch circuit SDL provided in the sense amplifier unit SAU shown in FIG. 16. That is, the sense amplifiers SA corresponding to the bit lines BL are selected by the latch circuit SDL specified by the addresses 11 to 13. In other words, a plurality of bits specifying one sense amplifier SA among a plurality of sense amplifiers SA are assigned to the addresses 11 to 13.

In the conventional memory system, lower to upper bits are allocated in address order. More specifically, traditionally (Conventional), low-order bits (SDL-Low-bit) are allocated to the add. 11, medium-order bits (SDL-Middle-bit) are allocated to the add. 12, and high-order bits (SDL-High-bit) are allocated to the add. 13 with respect to a logical address (Logical Address) and a physical address (Physical Address). That is, in the case where the add. 11=0, the add. 12=0, and the add. 13=0, a first latch circuit SDL0 corresponding to "000" is identified, and in the case where the add. 11=0, the add. 12=0, and the add. 13=1, a fifth latch circuit SDL4 corresponding to "100" is identified. In the present embodiment, data of the bit lines BL0 and BL4 or data of the bit lines BL1 to BL3 and BL5 to BL7 are read out as valid data. Therefore, in the conventional address allocation, data recognized as valid by the memory controller 2 is divided.

Figure 22:
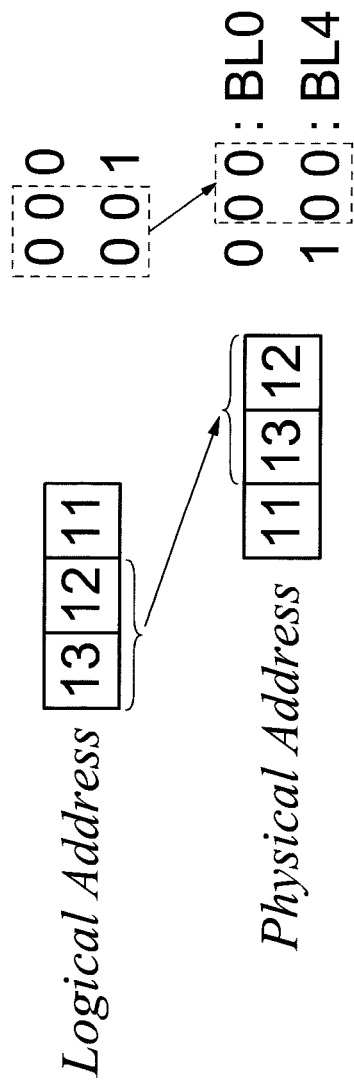
FIG. 22 is a diagram showing an example of converting an allocation of column addresses in a peripheral circuit of a memory system according to an embodiment.

On the other hand, in the memory system 1 according to the present embodiment (Embodiment), the address conversion from the logical address (Logical Address) to the physical address (Physical Address) is performed in the memory chip so that middle-order bits (SDL-Middle-bit) are allocated to the add.11, upper-order bits (SDL-High-bit) are allocated to the add.12, and lower-order bits (SDL-Low-bit) are allocated to the add.13. That is, as shown in FIG. 22, by performing the address conversion, logical addresses "000" and "001" corresponding to addresses recognized by the memory controller 2 are converted into physical addresses "000" and "100" corresponding to addresses in the memory chip. Therefore, the memory controller 2 can input and output data stored in a region divided into the bit lines BL0 and BL4 as consecutive data.

In other words, a peripheral circuit performs an internal address conversion in which the upper two bits of the logical address (Logical Address) among the plurality of bits specifying the sense amplifier SA are converted into the lower two bits of the physical address (Physical Address).

That is, the memory controller 2 can treat data of the memory cell transistor MT connected to the bit lines BL0 and BL4 of the first group GR1 and data of the memory cell transistor MT connected to the bit lines BL1 to BL3 and BL5 to BL7 of the second group GR2 as consecutive data without changing the connection relationship between the bit line BL and the sense amplifier SA.

Figure 23:
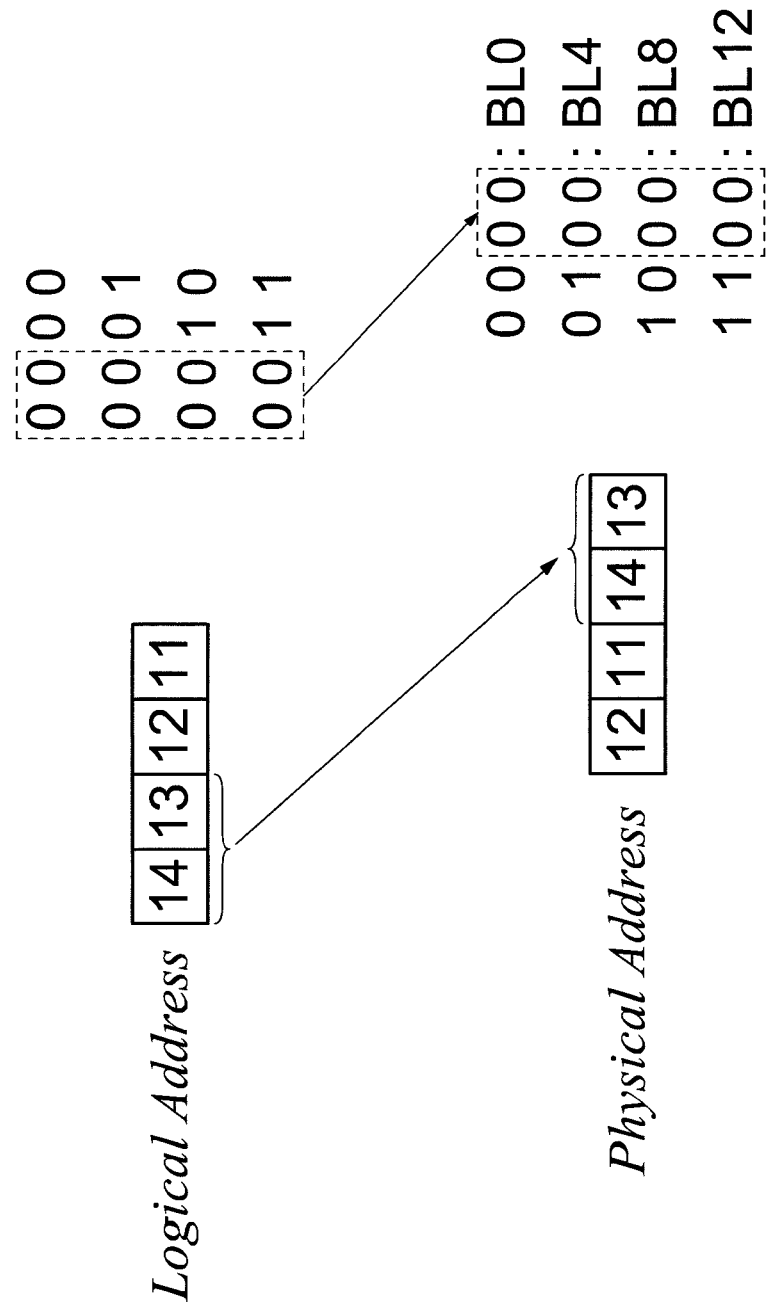
FIG. 23 is a diagram showing column address conversion in a peripheral circuit of a memory system according to an embodiment.

As shown in FIG. 23, in the case where 16 sense amplifiers SA are connected to 16 bit lines BL, the upper two bits of the logical address (Logical Address) are address-converted into the lower two bits of the physical address (Physical Address) in the same manner as described above. By the address conversion, the memory controller 2 can input and output data of the memory cell transistors MT corresponding to the bit lines BL0, 4, 8, and 12 arranged in the divided regions as consecutive data.

FIG. 24 shows a modification of the address conversion. This modification is an example in which 8 latch circuits SDL are designated by three bits. In this modification, the internal address conversion is performed such that an arrangement of 3 bits in the logical address (Logical address) is opposite to an arrangement of 3 bits in the physical address (Physical Address). By performing the internal address conversion in this way, the logical addresses "000" and "001" are internally address-converted to the physical addresses "000" and "100". Therefore, the memory controller 2 can input and output data stored in the divided regions of the bit lines BL0 and BL4 as consecutive data.

Figure 25:
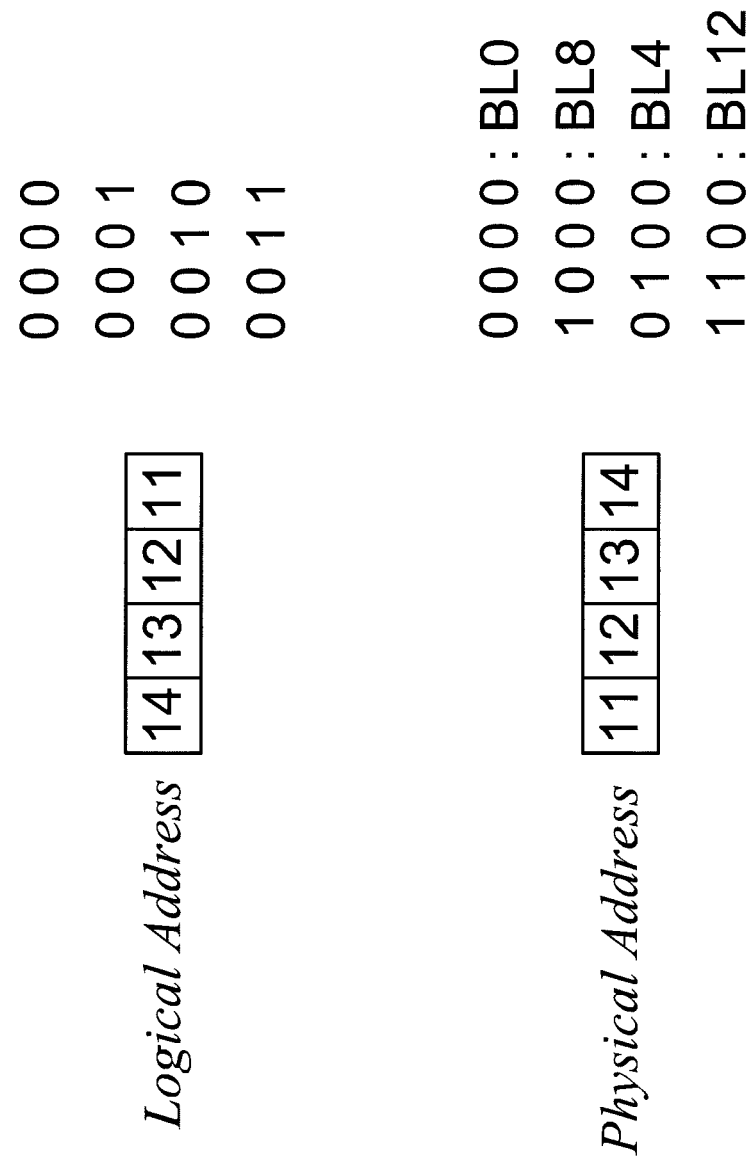
FIG. 25 is a diagram showing an example of converting an allocation of column addresses in a peripheral circuit of a memory system according to an embodiment.

A method of converting the logical address (Logical Address) into the physical address (Physical Address) by reversing an arrangement can be used in the case where the latch circuits SDL are 8 or more and a power of 2. For example, FIG. 25 shows an example in which 16 latch circuits SDL are designated by 4 bits. In this case, logical addresses "0000", "0001", "0010", and "0011" are internally address-converted to physical addresses "0000", "1000", "0100", and "1100". Therefore, the memory controller 2 can input and output data stored in the divided region of the bit lines BL0, BL4, BL8 and BL12 as consecutive data.

4. Fourth Embodiment

A memory system according to a fourth embodiment will be described with reference to FIG. 26 to FIG. 27. The memory system according to the fourth embodiment is similar to the memory system according to the first embodiment. In the following description, the same configuration as that of the memory system according to the first embodiment will be omitted, and differences from the memory system according to the first embodiment will be mainly described.

[4-1. Planar Layout of Select Gate Lines and Memory Pillars]

Figure 26:
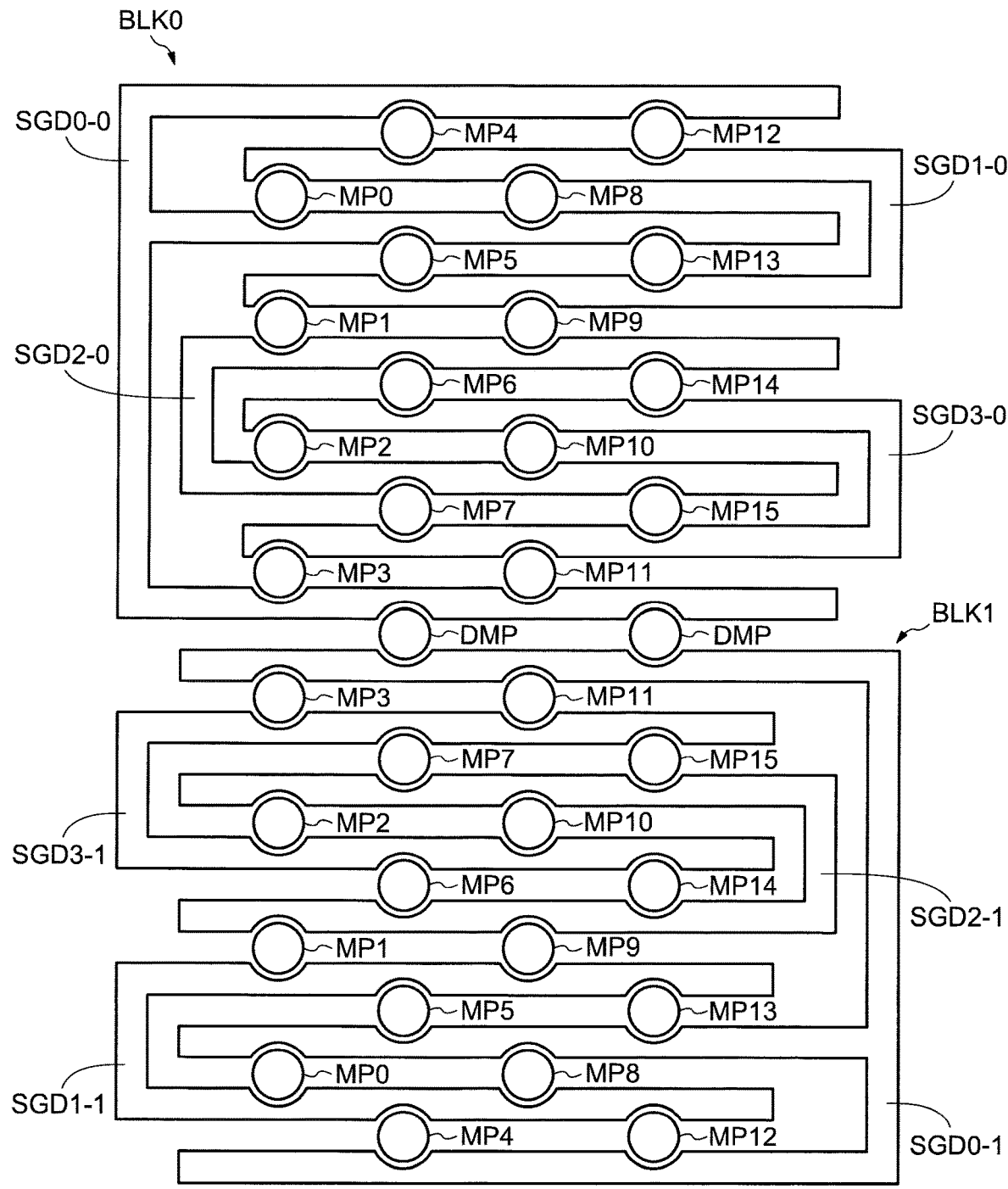
FIG. 26 is a diagram showing a layout of select gate lines and memory pillars of a semiconductor memory device according to an embodiment.

FIG. 26 is a diagram showing a layout of select gate lines and memory pillars of a semiconductor memory device according to an embodiment. In FIG. 26, select gate lines SGD0-0 to SGD3-0 and memory pillars MP0 to 15 according to a first block BLK0 are shown, and select gate lines SGD0-1 to SGD3-1 and memory pillars MP0 to 15 according to a second block BLK1 are shown. Dummy memory bodies DMP are provided between the select gate line SGD0-0 of the first block BLK0 and the select gate line SGD0-1 of the second block BLK1.

The dummy memory structure body DMP has the same configuration as that of the memory cell transistor MT. For example, a cross-sectional structure of the dummy memory structure body DMP is the same as the cross-sectional structure of the memory structure body described above. However, the dummy memory structure body DMP is not provided with the memory cell transistor MT functioning as a memory element. Alternatively, although the dummy memory structure body DMP is provided with substantially the same structure as the memory cell transistor MT, each electrode of the dummy memory structure body is not connected to a valid wiring. In the following explanation, in the case where there is no need to distinguish between the select gate line of the first block BLK0 and the second block BLK1 (for example, SGD0-0 and SGD0-1), it is simply referred to as a select gate line SGD0.

As shown in FIG. 26, the memory pillars MP0 to MP3 of the first block BLK0 and the memory pillars MP0 to MP3 of the second block BLK1 are arranged at substantially equal intervals in the Y-direction. The memory pillars MP4 to MP7 of the first block BLK0, DMP and the memory pillars MP4 to MP7 of the second block BLK1 are arranged at substantially equal intervals in the Y-direction. The memory pillars MP8 to MP11 of the first block BLK0 and the memory pillars MP8 to MP11 of the second block BLK1 are arranged at substantially equal intervals in the Y-direction. The memory pillars MP12 to MP15 of the first block BLK0, DMP and the memory pillars MP12 to MP15 of the second block BLK1 are arranged at substantially equal intervals in the Y-direction. Parts having a length in the X-direction in each of the select gate lines SGD0 to SGD3 included in the first block BLK0 and the second block BLK1 are arranged at substantially equal intervals in the Y-direction.

Although planar shapes of the select gate lines SGD0-0 to SGD3-0 included in the first block BLK0 are the same as planar shapes of the select gate lines SGD0-1 to SGD3-1 included in the second block BLK1, orientations thereof are different by 180 degrees. Specifically, if the planar shapes of the select gate lines SGD0-0 to SGD3-0 are rotated by 180 degrees on an X-Y plane with respect to any point between the first block BLK0 and the second block BLK1, the planar shapes coincide with the planar shapes of the select gate lines SGD0-1 to SGD3-1.

The planar shapes of the select gate lines SGD0-0 to SGD3-0 may not be the same as the planar shapes of the select gate lines SGD0-1 to SGD3-1. A positional relationship of the select gate lines SGD0-0 to SGD3-0 may be the same as a positional relationship rotated 180 degrees in a plan view from the select gate lines SGD0-1 to SGD3-1.

In other words, a positional relationship among the first gate line (SGD3-0), the second gate line (SGD2-0), and the third gate line (SGD0-0) in the first block BLK0 is the same as a positional relationship rotated 180 degrees in a plan view from a positional relationship among the first gate line (SGD3-1), the second gate line (SGD2-1), and the third gate line (SGD0-1) in the second block BLK1.

A positional relationship between the memory pillars MP0 to MP15 of the second block BLK1 and the select gate lines SGD0-1 to SGD3-1 is the same as a positional relationship between the memory pillars MP0 to MP15 of the first block BLK0 and the select gate lines SGD0-0 to SGD3-0. For example, the memory pillars MP2, MP6, MP7, MP10, MP14 and MP15 of the first block BLK0 are sandwiched by the select gate lines SGD2-0 and SGD3-0, and the memory pillars MP2, MP6, MP7, MP10, MP14 and MP15 of the second block BLK1 are sandwiched by the select gate lines SGD2-1 and SGD3-1. The memory pillars MP0 to MP15 of the first block BLK0 are line-symmetric with the memory pillars MP0 to MP15 of the second block BLK1 with respect to a border line between the first block BLK0 and the second block BLK1.

When the select gate line SGD, the word line WL, and the memory pillar MP are formed, a process of forming an insulating layer and a conductive layer and a process of etching the formed insulating layer and the conductive layer are repeatedly performed. As described above, since the planar patterns are regularly arranged, in-plane variations in film deposition rate and etching rate in these processes are reduced, and a more uniform structure can be obtained. That is, in FIG. 26, by providing the dummy memory structure body DMP between the first block BLK0 and the second block BLK1, it is possible to obtain a structure in which parts having a length in the X-direction in each of the select gate lines SGD0 to SGD3 and the memory pillars MP are regularly arranged in the vicinity of the border of the block.

According to the configuration of the present embodiment, a structure body provided at an end portion of the first block BLK0, specifically, the select gate line SGD0-0 and the memory pillars MP3 and 11 provided near an end portion in the second block BLK1 side of the first block BLK0 can be formed in the same manner as the other select gate lines SGD and the memory pillars MP. Similarly, a structure body provided at an end portion of the second block BLK1, specifically, the select gate line SGD0-1 and the memory pillars MP3 and 11 provided near an end portion in the first block BLK1 side of the second block BLK1 can be formed in the same manner as the other select gate lines SGD and the memory pillars MP.

As shown in FIG. 6 and FIG. 7, the word line WL is provided below the select gate line SGD. In the present embodiment, although only a positional relationship between the select gate line SGD and the dummy memory structure body DMP is shown, the dummy memory structure body DMP is also formed between the word line WL of the first block BLK0 and the word line WL of the second block BLK1.

In the present embodiment, if the even-numbered block (BLK0) and the odd-numbered block (BLK1) are compared, shapes of the select gate lines SGD having the same address are reversed from left to right. In this way, a read operation for a memory cell transistor of the select gate line SGD3 is executed for both the even-numbered block and the odd-numbered block. When the read operation is executed, the voltage VSG is applied to the select gate line SGD2, so that the data of the bit lines BL1 to BL3 and BL5 to BL7 becomes valid data. Similarly, since the voltage VSG is applied to the select gate line SGD0, the data of the bit lines BL0 and BL4 becomes valid data.

Figure 28:
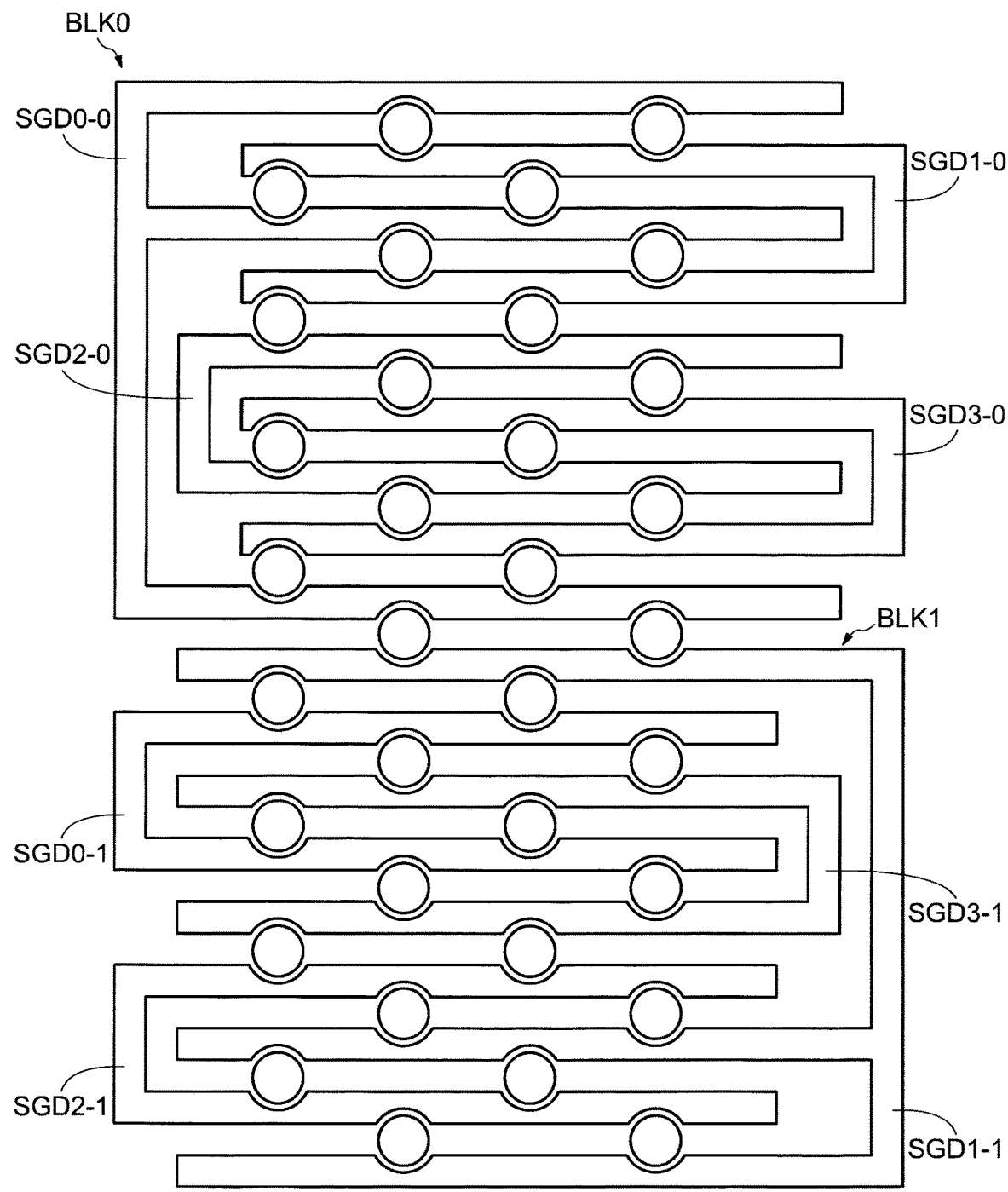
FIG. 28 is a diagram showing a layout of select gate lines and memory pillars of a semiconductor memory device according to a comparative example.

FIG. 28 is a diagram showing a layout of select gate lines and memory pillars of a semiconductor memory device according to a comparative example. As shown in FIG. 28, if directions of the select gate lines SGD having the same address are aligned in the same direction, when the even-numbered block (BLK0) and the odd-numbered block (BLK1) are compared in the case where a read operation is performed on the memory cell transistors MT belonging to the select gate lines SGD3-0 and the bit lines BL of the second group GR2 of the even-numbered block, a voltage for turning on a select transistor ST is supplied to the unselected select gate line SGD2-0.

On the other hand, in the case where the read operation is performed on the memory cell transistor MT belonging to the select gate line SGD3-1 of the odd-numbered block (BLK1) and the bit line BL of the second group GR2, a voltage for turning on the select transistor ST is supplied to the unselected select gate line SGD0-1. As described above, if directions of the select gate lines SGD having the same address in the left-right direction are the same between the even-numbered block and the odd-numbered block, addresses of the non-selected select gate lines SGD are different between the even-numbered block and the odd-numbered block. Therefore, an address control circuit needs to appropriately select USEL-SGD addresses that continue to apply the voltage VSG in accordance with select gate line SGD addresses in the even-numbered block and the odd-numbered block.

[4-2. Planar Layout of Select Gate Lines and Memory Pillars (Modification)]

Figure 27:
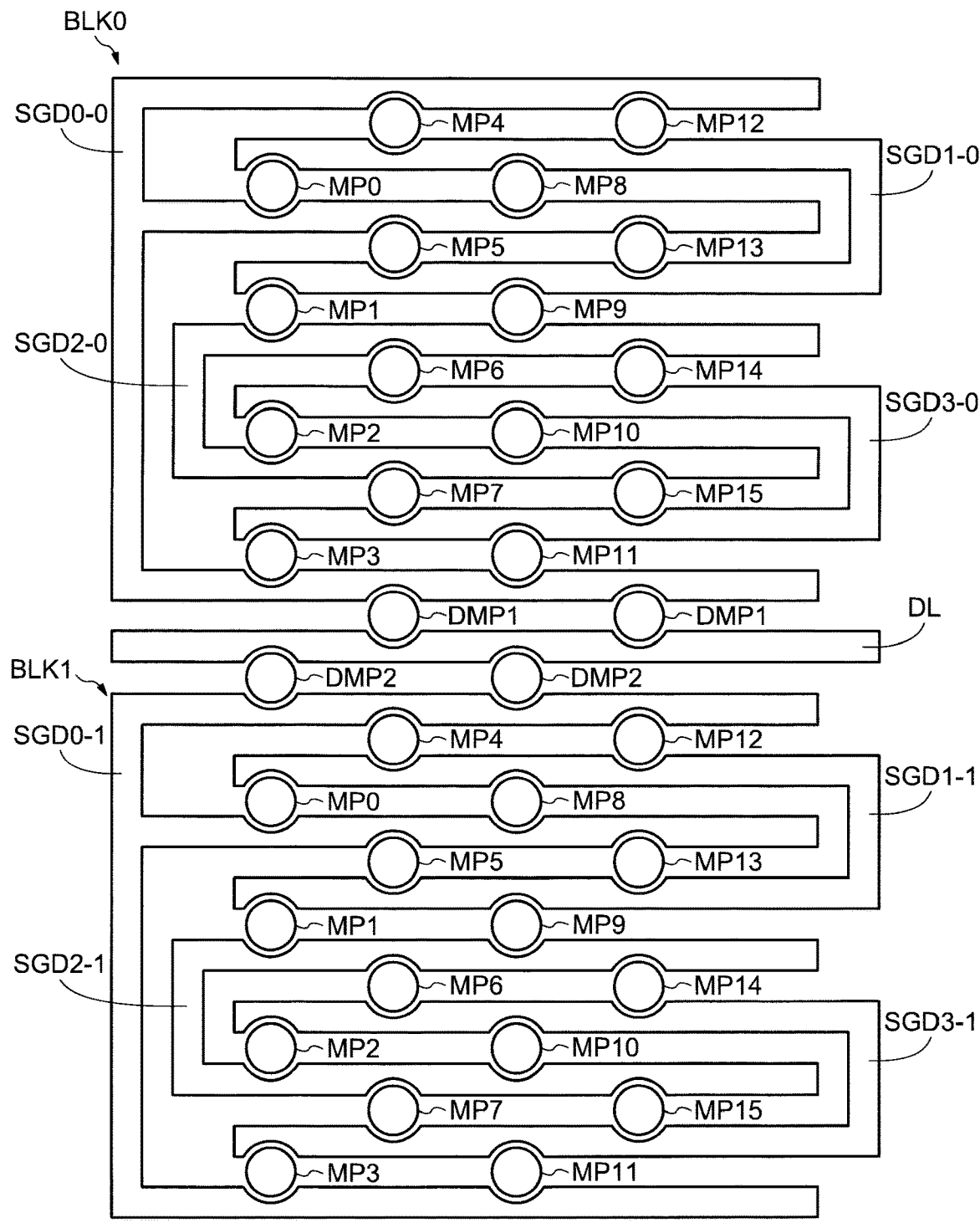
FIG. 27 is a diagram showing a layout of select gate lines and memory pillars of a semiconductor memory device according to an embodiment.

FIG. 27 is a diagram showing a layout of select gate lines and memory pillars of a semiconductor memory device according to an embodiment. Although the layout shown in FIG. 27 is similar to the layout shown in FIG. 26, it is different from the layout shown in FIG. 26 in that a dummy line DL is provided between the first block BLK0 and the second block BLK1, and in that each of the select gate lines SGD of the second block BLK1 and each of the select gate lines SGD of the first block BLK0 have the same orientation as well as a planar configuration. In the following description, description of the same configuration as in FIG. 26 will be omitted, and differences will be mainly described.

As shown in FIG. 27, the dummy line DL is provided between the first block BLK0 and the second block BLK1 adjoining in the Y-direction. The dummy line DL has a longitudinal in the X-direction, and is arranged at substantially equal intervals in the Y-direction with parts having a longitudinal in the X-direction in each of the select gate lines SGD0 to SGD3 included in the first block BLK0 and the second block BLK1.

The part of the first gate line (SGD3) having the longitudinal in the X-direction is referred to as a "first main gate portion". The part of the second gate line (SGD2) having the longitudinal in the X-direction is referred to as a "second main gate portion". The part of the third gate line (SGD0) having the longitudinal in the X-direction is referred to as a "third main gate portion". Here, a plurality of first pillars (for example, MP2 and MP10) are arranged in the X-direction between the first main gate portion and the second main gate portion. A plurality of second pillars (for example, MP3 and MP11) are arranged in the X-direction between the first main gate portion and the third main gate portion.

The dummy line DL is provided in the same layer as the select gate line SGD, and is formed of the same material as the select gate line SGD. In other words, the dummy line DL is provided on the same insulating layer as the select gate line SGD. In other words, both the dummy line DL and the select gate line SGD are in contact with the same insulating layers. The dummy line DL is floating. However, a fixed potential (for example, GND or the like) may be supplied to the dummy line DL. A dummy memory structure body DMP1 is provided between the select gate line SGD0-0 included in the first block BLK0 and the dummy line DL. A dummy memory structure body DMP2 is provided between the select gate line SGD0-1 included in the second block BLK1 and the dummy line DL. The dummy memory structure bodies DMP1 and DMP2 have the same configuration as the dummy memory structure body DMP of FIG. 26.

As shown in FIG. 27, the memory pillars MP0 to MP3 of the first block BLK0, DMP2 and the memory pillars MP0 to MP3 of the second block BLK1 are arranged at substantially equal intervals in the Y-direction. The memory pillars MP4 to MP7 of the first block BLK0, DMP1 and the memory pillars MP4 to MP7 of the second block BLK1 are arranged at substantially equal intervals in the Y-direction. The memory pillars MP8 to MP11 of the first block BLK0, DMP2 and the memory pillars MP8 to MP11 of the second block BLK1 are arranged at substantially equal intervals in the Y-direction. The memory pillars MP12 to MP15 of the first block BLK0, DMP1 and the memory pillars MP12 to MP15 of the second block BLK1 are arranged at substantially equal intervals in the Y-direction.

The planar shapes of the select gate lines SGD0-0 to SGD3-0 may not be the same as the planar shapes of the select gate lines SGD0-1 to SGD3-1. The positional relationship of the select gate lines SGD0-0 to SGD3-0 may be the same as the positional relationship of the select gate lines SGD0-1 to SGD3-1.

In other words, the positional relationship among the first gate line (SGD3-0), the second gate line (SGD2-0), and the third gate line (SGD0-0) in the first block BLK0 is the same as the positional relationship among the first gate line (SGD3-1), the second gate line (SGD2-1), and the third gate line (SGD0-1) in the second block BLK1. In the present embodiment, by arranging dummy memory structure bodies DMP in two rows, the shapes of the select gate lines SGD of the same address are the same in the even-numbered block (BLK0) and the odd-numbered block (BLK1). In this way, when the memory transistors of the select gate line SGD3 are read out in both the even-numbered block and the odd-numbered block, the voltage VSG is applied to the select gate line SGD2, so that the data of the bit lines BL1 to BL3 and BL5 to BL7 becomes valid data, and the voltage VSG is applied to the select gate line SGD1, so that the data of the bit lines BL0 and BL4 becomes valid data.

According to the configuration of the present embodiment, in addition to effects similar to those of the embodiment described above, interference of an electric field between adjacent blocks can be suppressed. That is, the dummy line DL has an electric field shielding function between the select gate line SGD0-0 of the first block BLK0 and the select gate line SGD0-1 of the second block BLK1. Therefore, a stable write operation and a stable read operation for the memory cell can be performed.

While the present invention has been described with reference to the accompanying drawings, the present invention is not limited to the above embodiments and can be appropriately modified without departing from the spirit of the present invention. For example, a person skilled in the art who adds, deletes, or changes designs of components as appropriate based on the memory system of the present embodiment is also included in the scope of the present invention as long as the gist of the present invention is provided. Furthermore, the embodiments described above can be appropriately combined as long as there is no mutual inconsistency, and technical matters common to the embodiments are included in the embodiments even if they are not explicitly described.

Even if it is other working effects which are different from the working effect brought about by the mode of each above-mentioned embodiment, what is clear from the description in this description, or what can be easily predicted by the person skilled in the art is naturally understood to be brought about by the present invention.

What is claimed is:

1. A memory system comprising:
   a first pillar including semiconductor;
   a first string adjacent to the first pillar and including a first transistor and a first memory cell connected in series;
   a second string adjacent to the first pillar and including a second transistor and a second memory cell connected in series;
   a first bit line connected to the first transistor and the second transistor;
   a first gate line connected to the first transistor and arranged above a first insulating layer;
   a first word line connected to the first memory cell and arranged above a second insulating layer;
   a second gate line connected to the second transistor, arranged above the first insulating layer and sandwiching the first pillar with the first gate line;
   a second word line connected to the second memory cell, arranged above the second insulating layer and sandwiching the first pillar with the first word line;
   a second pillar including a semiconductor;
   a third string adjacent to the second pillar and including a third transistor and a third memory cell connected in series;
   a fourth string adjacent to the second pillar and including a fourth transistor and a fourth memory cell connected in series;
   a second bit line connected to the third transistor and the fourth transistor;

a third gate line connected to the fourth transistor, arranged above the first insulating layer and sandwiching the second pillar with the first gate line; and
a control circuit,
wherein
the third transistor is connected to the first gate line,
the third memory cell is connected to the first word line,
the fourth memory cell is connected to the second word line,
the second pillar is sandwiched by the first word line and the second word line,
the first bit line and the second bit line overlap each of the first pillar and the second pillar in a plan view,
the first bit line is connected to the first pillar and is not connected to the second pillar,
the third bit line is connected to the second pillar and is not connected to the first pillar,
when the control circuit executes a read operation with respect to the first memory cell, the control circuit is configured to
apply a read voltage to the first word line,
apply a voltage turning off the second memory cell regardless of an electric charge stored in the second memory cell to the second word line,
apply a voltage turning on the first transistor to the first gate line, and
apply a voltage turning on the second transistor to the second gate line, and
when the control circuit executes a read operation with respect to the third memory cell, the control circuit is configured to
apply a read voltage to the first word line,
apply a voltage turning off the fourth memory cell regardless of an electric charge stored in the fourth memory cell to the second word line,
apply a voltage turning on the third transistor to the first gate line, and
apply a voltage turning on the fourth transistor to the second gate line.

2. The memory system according to claim 1 wherein when the control circuit executes a read operation with respect to the first memory cell, the control circuit is configured to apply a voltage to the first bit line and control the second bit line in a floating state.

3. The memory system according to claim 2 further comprising:
A third pillar including a semiconductor; and
a fifth string adjacent to the third pillar and including a fifth transistor and a fifth memory cell connected in series,
wherein
the fifth transistor is connected to the second bit line and the second gate line, and
the fifth memory cell is connected to the second word line.

4. The memory system according to claim 2 further comprising:
a plurality of first memory structure bodies, each of the plurality of first memory structure bodies including the first pillar, the first string and the second string,
a plurality of second memory structure bodies, each of the plurality of second memory structure bodies including the second pillar, the third string and the fourth string,
a plurality of first sense amplifiers, and
a plurality of second sense amplifiers assigned with an address larger than the plurality of first sense amplifiers,
wherein
a plurality of the first bit lines connected to the plurality of first memory structure bodies is connected to the plurality of first sense amplifiers, and
a plurality of the second bit lines connected to the plurality of second memory structure bodies is connected to the plurality of second sense amplifiers.

5. The memory system according to claim 2 further comprising:
a plurality of first memory structure bodies, each of the plurality of first memory structure bodies including the first pillar, the first string and the second string,
a plurality of second memory structure bodies, each of the plurality of second memory structure bodies including the second pillar, the third string and the fourth string,
a plurality of sense amplifiers connected to a plurality of bit lines including the first bit line and the second bit line, respectively, and
a peripheral circuit connected to the plurality of sense amplifiers,
wherein
the peripheral circuit is configured to convert upper n bits including the most significant bit of a logical address into lower n bits including the least significant bit of a physical address (n is a natural number) among a plurality of bits specifying one sense amplifier among the plurality of sense amplifiers.

6. The memory system according to claim 2 further comprising:
a plurality of first memory structure bodies, each of the plurality of first memory structure bodies including the first pillar, the first string and the second string,
a plurality of second memory structure bodies, each of the plurality of second memory structure bodies including the second pillar, the third string and the fourth string,
a plurality of sense amplifiers connected to a plurality of bit lines including the first bit line and the second bit line, respectively, and
a peripheral circuit connected to the plurality of sense amplifiers,
wherein
the peripheral circuit is configured to convert a first sequence of bits in a logical address into a second sequence of bits in a physical address among a plurality of bits specifying one sense amplifier among the plurality of sense amplifiers, and
the order of bits in the first sequence is a reverse of the order of bits in the second sequence.

7. The memory system according to claim 2 further comprising:
a plurality of first memory structure bodies, each of the plurality of first memory structure bodies including the first pillar, the first string and the second string,
a plurality of second memory structure bodies, each of the plurality of second memory structure bodies including the second pillar, the third string and the fourth string,
a plurality of first sense amplifiers, and
a plurality of second sense amplifiers assigned with an address larger than the plurality of first sense amplifiers,
wherein
a plurality of the first bit lines connected to the plurality of first memory structure bodies is connected to the plurality of second sense amplifiers, and
a plurality of the second bit lines connected to the plurality of second memory structure bodies is connected to the plurality of first sense amplifiers.

8. The memory system according to claim 2 further comprising:
- a first block and a second block, and
- a plurality of dummy memory structure bodies arranged between the first block and the second block, wherein each of the first block and the second block includes
- a plurality of first memory structure bodies, each of the plurality of first memory structure bodies including the first pillar, the first string and the second string,
- a plurality of second memory structure bodies, each of the plurality of second memory structure bodies including the second pillar, the third string and the fourth string, and
- the first bit line, the second bit line, the first gate line, the second gate line, the third gate line, the first word line and the second word line.

9. The memory system according to claim 8 wherein a cross sectional structure of the dummy memory structure body is the same as a cross sectional structure of the first memory structure body or the second memory structure body.

10. The memory system according to claim 8 wherein a positional relationship of the first gate line, the second gate line and the third gate line in the first block is the same as a positional relationship rotated 180 degrees in a plan view from a positional relationship of the first gate line, the second gate line and the third gate line in the second block.

11. The memory system according to claim 8 further comprising a dummy line arranged between the first block and the second block, wherein
- the first block and the second block are adjacent in a first direction,
- the first gate line includes a first main gate portion having a longitudinal in a second direction intersecting the first direction,
- the second gate line includes a second main gate portion having a longitudinal in the second direction,
- the third gate line includes a third main gate portion having a longitudinal in the second direction,
- a plurality of the first pillars are aligned in the second direction between the first main gate portion and the second main gate portion,
- a plurality of the second pillars are aligned in the second direction between the first main gate portion and the third main gate portion,
- the dummy line has a longitudinal in the second direction,
- the plurality of dummy memory structure bodies are arranged between the dummy line and the first block, and arranged between the dummy line and the second block, and
- a positional relationship of the first gate line, the second gate line and the third gate line in the first block is the same as a positional relationship of the first gate line, the second gate line and the third gate line in the second block.

12. The memory system according to claim 1 wherein the first gate line includes
- a first portion having a longitudinal in a first direction,
- a second portion facing the first portion in a second direction intersecting the first direction, and
- a connecting portion connecting an edge portion of the first portion and an edge portion of the second portion in the first direction.

13. The memory system according to claim 12 wherein
- the first pillar and the second pillar are aligned in the second direction,
- the first portion faces the first pillar, and
- the second portion faces the second pillar.

* * * * *